(12) United States Patent
Kawada

(10) Patent No.: US 7,058,216 B2
(45) Date of Patent: Jun. 6, 2006

(54) APPARATUS FOR DETECTING LEAD COPLANARITY, APPARATUS FOR DETECTING CONDITION OF ELECTRONIC COMPONENT, AND SYSTEM FOR MOUNTING ELECTRONIC COMPONENT

(75) Inventor: Tosuke Kawada, Chiryu (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 745 days.

(21) Appl. No.: 09/991,909

(22) Filed: Nov. 26, 2001

(65) Prior Publication Data

US 2002/0071601 A1    Jun. 13, 2002

(30) Foreign Application Priority Data

Dec. 8, 2000    (JP) .............................. 2000-374935

(51) Int. Cl.
*G06K 9/00*    (2006.01)
(52) U.S. Cl. ...................... 382/146; 382/145; 356/614; 29/833
(58) Field of Classification Search ................ 382/146, 382/147, 151, 149, 152, 203, 216, 296, 305, 382/312, 145; 361/748, 760, 761, 679, 772, 361/774, 773, 767, 720, 764, 718, 719, 736; 29/740, 833; 174/250; 439/70; 348/126; 356/614
See application file for complete search history.

(56) References Cited

U.S. PATENT DOCUMENTS

| | | | | |
|---|---|---|---|---|
| 4,686,637 A | * | 8/1987 | Linker et al. ................ 382/146 |
| 5,563,703 A | * | 10/1996 | Lebeau et al. ............ 356/237.5 |
| 5,754,677 A | | 5/1998 | Kawada | |
| 5,805,722 A | * | 9/1998 | Cullen et al. ............... 382/146 |
| 5,956,134 A | * | 9/1999 | Roy et al. ................. 356/237.5 |
| 6,141,040 A | * | 10/2000 | Toh ............................. 348/126 |
| 6,242,756 B1 | * | 6/2001 | Toh et al. ............... 250/559.34 |
| 6,242,765 B1 | * | 6/2001 | Nashimoto ................... 257/192 |
| 6,243,164 B1 | * | 6/2001 | Baldwin et al. ............ 356/624 |

FOREIGN PATENT DOCUMENTS

| | | |
|---|---|---|
| JP | B2 2-57719 | 12/1990 |
| JP | A 3-203251 | 9/1991 |
| JP | A 4-372199 | 12/1992 |
| JP | B2 7-70872 | 7/1995 |
| JP | A 8-180191 | 7/1996 |
| JP | B2 2824378 | 9/1998 |

* cited by examiner

Primary Examiner—Sheela Chawan
(74) Attorney, Agent, or Firm—Oliff & Berridge, PLC.

(57) ABSTRACT

An apparatus for detecting a coplanarity of a plurality of leads of an electronic component that laterally extend from a main body thereof, including a holding device which holds the main body of the electronic component at an upper surface of the main body, an image taking device which faces the electronic component held by the holding device and has an optical axis that is inclined by a predetermined angle relative to a plane containing a bottom surface of the main body such that in a direction from the image taking device toward the main body, the optical axis goes down in a direction from the upper surface to the bottom surface, a background forming device which is provided on one of opposite sides of the electronic component that is opposite to the other side thereof on which the image taking device is provided, and which forms a background having an optical characteristic different from an optical characteristic of the leads, and an image processing device which processes an image of respective end portions of the leads taken by the image taking device and thereby determines the coplanarity of the leads.

19 Claims, 13 Drawing Sheets

APPARATUS FOR DETECTING LEAD COPLANARITY, APPARATUS FOR DETECTING CONDITION OF ELECTRONIC COMPONENT, AND SYSTEM FOR MOUNTING ELECTRONIC COMPONENT

BACKGROUND OF THE INVENTION

1. Field of the Invention

The present invention relates to a coplanarity detecting apparatus, an electronic-component-condition detecting apparatus, and an electric-component mounting system, and particularly to the art of quickly carrying out detection or mounting.

2. Discussion of Related Art

There is known an electronic component including a main portion or body and a plurality of leads laterally extending from the main body, and there are some cases where it is needed to detect a coplanarity of the leads, that is, a degree of positioning of respective end portions of the leads in a same plane. For example, in the case where the electronic component is mounted on a printed-wiring board, the leads are placed on, and connected to, an electric circuit provided on the printed-wiring board. However, if the component has one or more upwardly deformed leads, those leads cannot contact the circuit, which leads to producing a defective circuit.

Conventionally, a laser length measuring machine has been used to detect coplanarity, i.e., measure a height position of each of the leads. If the leads includes a deformed lead, an end portion of the deformed lead has a height position different from those of respective end portions of the other leads, and is deviated from a plane in which the end portion of the lead should be positioned. Thus, the coplanarity of the leads can be detected. To this end, the electronic component is moved relative to the laser length measuring machine, while the respective height positions of respective end portions of the leads are sequentially measured by the measuring machine.

However, the laser length measuring machine has various problems. For example, if an electronic component is rotated out of position about an axis line perpendicular to an upper surface thereof and accordingly has an angular-positional error relative to the measuring machine, in a plane parallel to the upper and bottom surfaces thereof, one or more leads may not be aligned with the measuring machine, when the component is moved relative to the machine, and accordingly respective height positions of those leads may not be measured. In this case, a coplanarity of the leads may not be detected.

If a preliminary inspection is carried out, before a coplanarity detection is done, to take an image of an electric component as viewed in a direction perpendicular to a bottom surface of the component, a possible angular-positional error of the component can be corrected based on the thus taken image. In this case, respective height positions of all the leads can be measured, and a coplanarity of the leads can be detected. However, since the preliminary inspection is needed, a time needed to carry out the coplanarity detection is increased as such.

In a particular case where it is needed to detect a positional error of an electric component held by a holding device, relative to the holding device, in a direction parallel to an upper surface of the component, a time needed to carry out a coplanarity detection is not increased if an image of the component taken for detecting the positional error is also used for carrying out a preliminary inspection. However, if the component is rotated to detect coplanarity and then is rotated back to an initial position at the time of preliminary inspection, i.e., positional-error detection, the component cannot be accurately back to the initial position because of inevitable rotational error thereof. Thus, the positional error detected previously may not be equal to an actual positional error of the component. To solve this problem, it is needed to take another image of the component, thereby increasing the time needed to carry out the coplanarity detection.

In addition, the laser length measuring machine is expensive, which leads to increasing the cost of coplanarity detection.

SUMMARY OF THE INVENTION

It is therefore an object of the present invention to provide a lead-coplanarity detecting apparatus, an electronic-component-condition detecting apparatus, and an electronic-component mounting system each of which is free of at least one of the problem of an increased time needed to detect a coplanarity of leads of an electronic component and the problem of an increased cost to detect the same. The above object may be achieved according to any one of the following modes of the present invention in the form of a lead-coplanarity detecting apparatus, an electronic-component-condition detecting apparatus, and an electronic-component mounting system. Each of the following modes of the invention is numbered like the appended claims and depends from the other mode or modes, where appropriate, to indicate and clarify possible combinations of elements or technical features. It is to be understood that the present invention is not limited to the technical features or any combinations thereof which will be described for illustrative purposes only. It is to be further understood that a plurality of elements or features included in any one of the following modes of the invention are not necessarily provided all together, and that the invention may be embodied without some of the elements or features described with respect to each of the modes.

(1) According to a first mode of the present invention, there is provided an apparatus for detecting a coplanarity of a plurality of leads of an electronic component that laterally extend from a main body thereof, comprising a holding device which holds the main body of the electronic component at an upper or top surface of the main body; an image taking device which faces the electronic component held by the holding device and has an optical axis that is inclined by a predetermined angle relative to a lower or bottom surface of the main body such that in a direction from the image taking device toward the main body, the optical axis goes down in a direction from the upper surface to the bottom surface; a background forming device which is provided on one of opposite sides of the electronic component that is opposite to the other side thereof on which the image taking device is provided, and which forms a background having an optical characteristic different from an optical characteristic of the leads; and an image processing device which processes an image of respective end portions of the leads taken by the image taking device and thereby determines the coplanarity of the leads.

The image taking device may be one which includes a direction changing device, such as a mirror or a prism, that change a direction of a light; and a camera, or one which includes a camera but does not include a direction changing device. In the former case, the direction changing device is provided such that the device faces the electronic component.

The angle of inclination of the optical axis of the image taking device relative to the plane containing the bottom surface of the main body of the electronic component is so predetermined that the image of the respective end portions of the leads does not overlap an image of the main body. However, it is not essentially required that an image of an end portion or portions of one or more leads greatly bent in a direction perpendicular to the bottom surface of the main body does not overlap the image of the main body. In addition, it is preferred that as long as this requirement is met, the angle of inclination of the optical axis be as small as possible. This angle may be changed depending upon the shape and/or size of leads of each kind of electronic components. Generally, this angle preferably falls within a range of from 2 to 15 degrees, more preferably within a range of from 3 to 12 degrees, and most preferably within a range of from 4 to 10 degrees.

The holding device may be one which includes a plurality of grasping jaws that can be opened and closed and can engage side surfaces of the main body of the electronic component; or one which includes a suction nozzle that applies a suction or negative pressure to the upper surface of the main body of the component and thereby holds the main body.

The background forming device may be any device that can form a background image having an optical nature distinguishable from that of the image of the leads. For example, the background forming device may comprise a light emitter according to the second mode (2), described below, or a light absorber in a particular case where the leads are ones which reflect light. A light-reflecting or light-absorbing nature of the background forming device may be changed by selecting a color and/or a material of the forming device, so that the image of the leads and the image of the background are clearly distinguishable from each other.

The image taking device can take, at once, an image of a plurality of leads extending from one portion of the electronic component that is located on the side of the image taking device. Since the optical axis of the image taking device is inclined relative to the plane containing the bottom surface of the component, the image taking device can take, even if one or more leads may be more or less bent upwardly, an image of respective end portions of the leads that does not overlap the image of the main body or an image of respective base portions of the leads. In addition, even if the component may have leads extending from another portion thereof that is opposite to the above-indicated one portion, the image taking device can avoid taking an image of those irrelevant leads, i.e., can take the image of the relevant leads only.

An image taken from a lead that is bent in a direction perpendicular to the bottom surface of the main body of the electronic component, has different length and position than those of an image taken from the same lead that, however, is not bent. Thus, a coplanarity of the lead can be detected. The image taking device is provided such that the optical axis thereof is inclined. However, since the angle of inclination of the optical axis is sufficiently small, the image processing device can determine the amount of bending of the lead with substantially no errors.

In this way, even if the electronic component may have an angular-positional error, the image taking device can take, at once, an image of the relevant leads that face the image taking device and are located between the main body and the device. Therefore, it is not essentially required to carry out a preliminary inspection. In the case where the electronic component has no angular-positional error, or has just a small angular-positional error that does not influence the detection of coplanarity, it is not needed to carry out the preliminary inspection. Thus, the coplanarity can be detected quickly and by the image taking device that is less expensive than the laser length measuring machine.

In the case where the electronic-component has a large angular-positional error that adversely influences the detection of coplanarity, it is preferred that the preliminary inspection be carried out to detect the angular-positional error and, after the error is corrected, the coplanarity be detected. If the electronic-component has a large angular-positional error, then an image of the lead is formed at a different position on the image taking face of the image taking device, or a lead that is not bent is judged as being bent. Since the image of the lead is formed as if it is inclined, the length of the lead cannot be accurately determined. Thus, the detection of coplanarity is adversely influenced. To avoid this, the preliminary inspection is carried out to detect the angular-positional error of the lead and correct the error before the detection of coplanarity. Though the time needed to detect the coplanarity cannot be shortened, the detection of coplanarity can be carried out at low cost.

(2) According to a second mode of the present invention that depends from the first mode (1), the background forming device comprises a light emitter which emits a light toward the electronic component and the image taking device.

The light emitter may be one which comprises a light source, or one which receives a light emitted by an independent light source and emits the received light. In the latter case, the light emitter may be a light diffusing member which diffuses a light emitted by a light source; a light reflecting member which reflects a light emitted by a light source; or a fluorescent member which absorbs an ultraviolet light emitted by a ultraviolet-light source and emits a visible light.

According to this mode, a dark image of the leads is formed in a light background, so that the image of the leads can be clearly distinguished, by image processing, from the image of the background.

(3) According to a third mode of the present invention that depends from the first or second mode (1) or (2), the holding device comprises a rotating device which rotates the electronic component about an axis line that is perpendicular to the upper surface of the main body and passes through a substantial center of the upper surface.

(4) According to a fourth mode of the present invention that depends from the third mode (3), the main body of the electronic component has, in a plan view thereof, a shape having a plurality of sides from each of which the leads laterally extend, and the rotating device rotates the electronic component to an angular position at which the each of the sides of the main body extends in a direction substantially perpendicular to the optical axis of the image taking device, at a position between the axis line and the optical axis.

Generally, the shape of the main body, in its plan view, is a polygonal shape that is defined by a plurality of straight sides only. However, this is not an essential feature. For example, the shape of the main body may be a shape that is defined by one or more straight sides and one or more curved sides. In either case, the coplanarity detecting apparatus according to the present invention can detect a coplanarity of one or more leads laterally extending from the side or sides. The most common shape of the main body is a quadrangular shape, and there is known an electric component having leads extending from all four sides of a quadrangular main body thereof, and an electric component having leads extending from only two parallel sides of a quadrangular main body thereof. In the former case, the rotating device rotates the component at least three times, each by 90 degrees; and in the latter case, the rotating device rotates the component at least one time by 180 degrees.

(5) According to a fifth mode of the present invention that depends from any one of the first to fourth modes (1) to (4), the coplanarity detecting apparatus further comprises a judging device which judges, based on the coplanarity determined by the image processing device, whether the electronic component is acceptable.

The judging device can judge whether the electronic component is acceptable, in any one of various manners. For example, it is possible to produce reference information based on the image of all the leads of the component and judge whether an amount of deviation of each of the leads from the reference information is smaller than a predetermined amount. Alternatively, in the case where the main body of the component has a polygonal shape, it is possible to produce each-side-related reference information based on the image of the leads extending from each of the sides of the main body and judge whether an amount of deviation of each of those leads from the each-side-related reference information is smaller than a predetermined amount. In the latter case, if it is judged that the respective deviation amounts of all those leads are smaller than the predetermined amount, then the judging device additionally produces all-side-related reference information based on the respective sets of each-side-related reference information produced for the respective sides of the main body, and judges whether a deviation amount of each of the sets of each-side-related reference information from the all-side-related reference information is smaller than a predetermined amount.

(6) According to a sixth mode of the present invention, there is provided an apparatus for detecting a condition of an electronic component, comprising a coplanarity detecting apparatus according to any one of the first to fifth modes (1) to (5); and a second image taking device which is different from a first image taking device as the image taking device of the coplanarity detecting apparatus and which takes an image of at least the bottom surface of the main body of the electronic component as viewed in a direction perpendicular to the bottom surface of the main body, and the image processing device comprises, in addition to a first image processing portion which determines the coplanarity, a second image processing portion which processes the image of the electronic component taken by the second image taking device and thereby determines at least one positional error of the electronic component relative to the holding device in at least one direction parallel to the upper surface of the main body.

The positional error of the electronic component relative to the holding device, determined by the second image processing portion, can be utilized in any one of various manners. For example, in the case where the component is mounted on a printed-wiring board, the component can be accurately mounted at a correct position on the board while the positional error is corrected. If the positional error is too great to correct, the component can be discarded without being mounted on the board.

According to this mode, the electronic component can be handled based on not only the detected coplanarity but also the positional error of the component relative to the holding device. Thus, the component can be handled more easily.

(7) According to a seventh mode of the present invention that depends from the sixth mode (6), the first and second image taking devices are provided at respective positions at which the first and second image taking devices can take the image of the leads of the electronic component and the image of the bottom surface of the electronic component, respectively, in a state in which the electronic component is positioned at a same position.

Alternatively, the first and second image taking devices may be provided at respective positions at which the first and second image taking devices can take the image of the leads of the electronic component and the image of the bottom surface of the component, when the component is positioned at different positions, respectively. However, according to the seventh mode, the holding device may be moved relative to the first and second image taking devices and, while the component held by the holding device is stopped at a single position, the first and second image taking devices may take respective images of the component. Thus, the image taking operation can be carried out in a short time, and a coplanarity and a positional error can be determined quickly.

(8) According to an eighth mode of the present invention that depends from the sixth or seventh mode (6) or (7), the electronic-component-condition detecting apparatus further comprises an image-taking-device control portion which first controls the first image taking device to take the image of the electronic component and then controls the second image taking device to take the image of the electronic component.

Alternatively, it is possible to operate the first and second image taking devices to simultaneously take respective images of the electronic component and simultaneously determine a coplanarity and a positional error of the component. However, according to the eighth mode, it is possible to omit a useless image taking action and/or a useless image processing action. For example, in the case where a detected coplanarity of the component is used in judging whether the coplanarity of the component is so high that the component can be mounted on a printed-wiring board, the second image taking device need not take an image of the component or determine a positional error of the component, if the detected coplanarity of the component is too low and accordingly the component cannot be mounted on the board.

(9) According to a ninth mode of the present invention that depends from the eighth mode (8), the holding device comprises a rotating device which rotates the electronic component about an axis line that is perpendicular to the upper surface of the main body and passes through a substantial center of the upper surface, and the image-taking-device control portion controls the rotating device to rotate the electronic component to an angular position at which the electronic component is to be mounted on a circuit substrate, and subsequently controls the second image taking device to take the image of the electronic component.

According to this mode, the rotating device may rotate the electronic component so as to detect a coplanarity thereof. However, after this rotation, the rotating device additionally rotates the component to an angular position at which the component is to be mounted on a circuit substrate such as a printed-wiring board. This angular position of the component is maintained till the component is mounted on the substrte. Generally speaking, when the electronic component is rotated by the rotating device, some angular-positional error occurs to the component. However, after the second image taking device takes an image of the component, the component is not rotated any more. Therefore, the positional error determined based on the image taken by the second image taking device accurately represents the actual positional error of the component. Thus, the positional error determined based on the image taken by the second image taking device can be used to accurately mount the component on the substrate.

(10) According to a tenth mode of the present invention, there is provided a system for mounting at least one electronic component on a circuit substrate, comprising an electronic-component-condition detecting apparatus according to any one of the sixth to ninth modes; a supplying device which supplies the electronic component to the holding device of the electronic-component-condition detecting apparatus; a supporting device which supports the circuit substrate; a moving device which moves, while correcting the positional error of the electronic component detected by the image processing device of the electronic-component-condition detecting device, the holding device holding the electronic component, from the supplying device to the supporting device via the first and second image taking devices, and allows the holding device to mount the electronic component on the circuit substrate supported by the supporting device; and a coplanarity-utilizing control means for controlling the moving device while utilizing the coplanarity detected by the coplanarity detecting apparatus of the electronic-component-condition detecting apparatus.

The circuit substrate may be a printed-wiring board which includes an insulating substrate and a printed circuit formed thereon and on which no electronic components are present; or a printed circuit board on which electronic components are mounted on a printed circuit and are soldered to the circuit to provide an electric circuit. The printed-wiring board may be one on only a portion of which electronic components are mounted.

The moving device may be one which moves the holding device in one direction in a plane parallel to a surface of the circuit substrate; or one which moves the holding device in each of two directions that are perpendicular to each other in the plane. In the former case, the circuit substrate is moved by a circuit-substrate moving device in a direction perpendicular to the direction in which the holding device is moved by the moving device.

The coplanarity-utilizing control means may be one which controls, based on the coplanarity detected by the coplanarity detecting apparatus, a pressing load with which the electronic component is pressed against the circuit substrate; or a discarding control means according to the eleventh mode, described below. In the former case, a low pressing load may be applied to an electronic component whose coplanarity is high, and a high pressing load may be applied to an electronic component whose coplanarity is not high. The pressing load may be changed continuously in proportion to coplanarity, or changed stepwise in two or more steps.

(11) According to an eleventh mode of the present invention that depends from the tenth mode (10), the coplanarity detecting apparatus comprises a judging device which judges, based on the coplanarity detected by the image processing device, whether the electronic component is acceptable, and the coplanarity-utilizing control means comprises a discarding control means for controlling, when the judging device judges that the electronic component is not acceptable, the moving device to discard the electronic component at a predetermined discarding position.

(12) According to a twelfth mode of the present invention that depends from the tenth or eleventh mode (10) or (11), the moving device comprises an X-axis slide which is movable in an X-axis direction parallel to an X axis of an X-Y coordinate plane parallel to a surface of the circuit substrate; an X-axis-slide moving device which moves the X-axis slide to an arbitrary position in the X-axis direction; a Y-axis slide which is supported by the X-axis slide such that the Y-axis slide is movable relative to the X-axis slide in a Y-axis direction parallel to a Y axis of the X-Y coordinate plane that is perpendicular to the X axis; and a Y-axis-slide moving device which moves the Y-axis slide to an arbitrary position in the Y-axis direction, and the holding device is supported by the Y-axis slide.

(13) According to a thirteenth mode of the present invention that depends from the twelfth mode (12), the first and second image taking devices are provided at respective positions at which the first and second image taking devices can take the image of the leads of the electronic component and the image of the bottom surface of the electronic component, respectively, in a state in which the electronic component is on a path of movement thereof caused by a movement of the Y-axis slide relative to the X-axis slide.

According to this mode, the holding device holding the electronic component is necessarily moved to the circuit substrate via a position where an image of the component can be taken, and is actually taken, by each of the first and second image taking devices. Therefore, the holding device need not make a long detour for each of the two image taking devices to take an image of the component, that is, the holding device can be moved on the shortest way from a component-supply position of a component-supply device to a component-mounting place on the circuit substrate. Thus, the present system can quickly mount the electronic component on the circuit substrate while detecting the coplanarity and positional error of the component. Stated differently, the present system can detect the coplanarity of the component while preventing the increasing of distance of movement needed for carrying out the image taking operation.

(14) According to a fourteenth mode of the present invention that depends from the thirteenth mode (13), the background forming device is provided on the X-axis slide.

The background forming device is moved with the X-axis slide and, when the holding device is moved to a position where an image of the electronic component held thereby can be taken by the first image taking device, the forming device forms a background for the component and thereby enables the first image taking device to take the image of the component in the background formed.

(15) According to a fifteenth mode of the present invention that depends from the fourteenth mode (14), the first image taking device comprises a camera which is provided at a position where the camera faces the background forming device through the electronic component held by the holding device.

(16) According to a sixteenth mode of the present invention that depends from any one of the tenth to fifteenth modes (10) to (15), the second image taking device comprises a direction changing device which is provided on the X-axis slide such that a first portion of the direction changing device faces the electronic component held by the holding device, and a camera which is also provided on the X-axis slide such that the camera faces a second portion of the direction changing device.

The second image taking device may be one which includes a camera that is provided at a position where the camera can face the electronic component held by the holding device, but does not include a direction changing device, or one which includes a direction changing device that is provided at a position where the direction changing device can face the component, and a camera that is provided on the Y-axis slide. However, according to the sixteenth mode, since the direction changing device changes the direction of the light forming the image of the component, the camera can enjoy an increased degree of freedom with respect to how the camera is provided. In addition, since the second image taking device is not provided on the Y-axis slide, the Y-axis slide can enjoy a low weight and a small inertia and accordingly can be moved at an increased speed. Moreover, it is not needed to provide, on the Y-axis slide, any electric wires connected to the camera.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
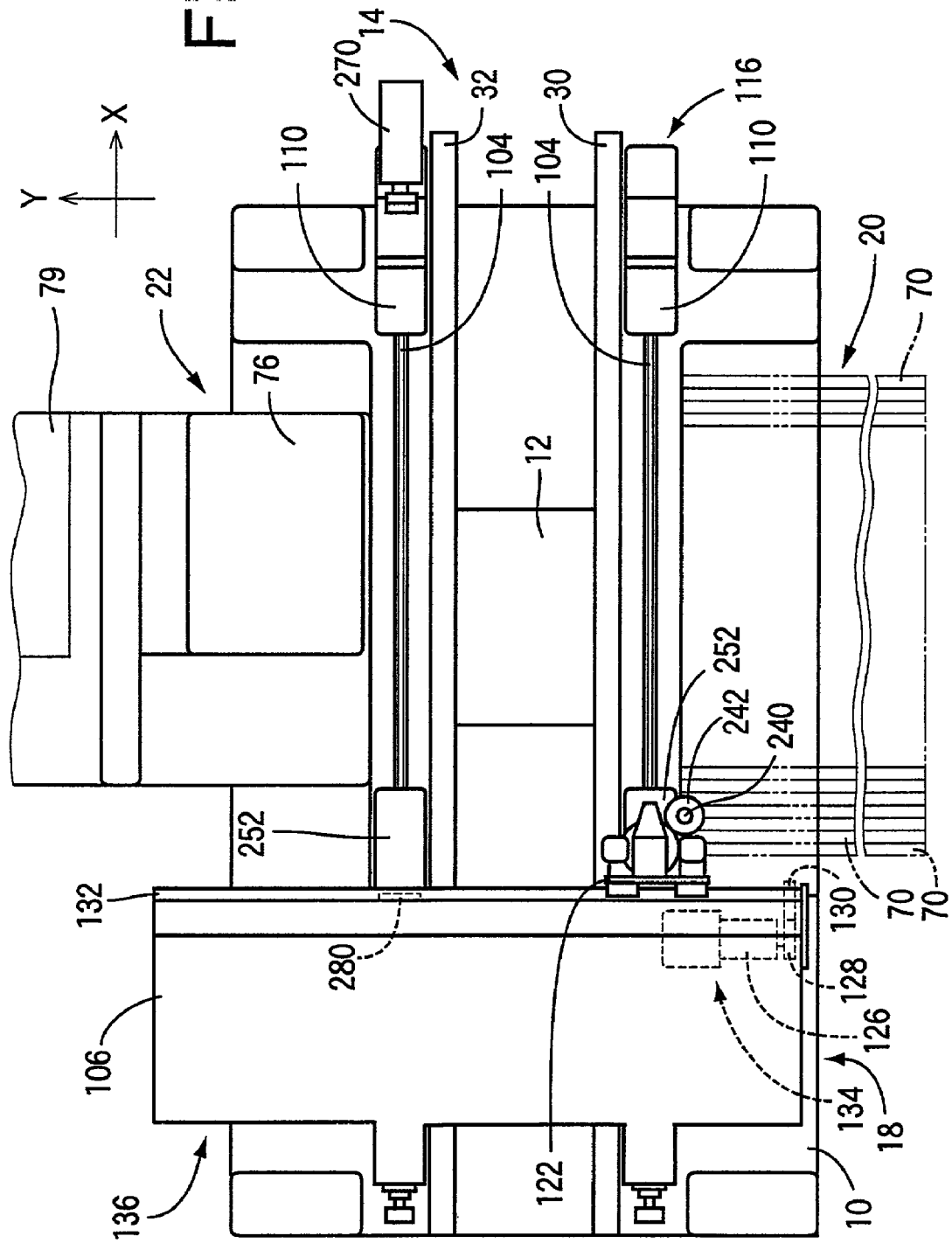
FIG. 1 is a plan view showing an electronic-component mounting system constructed according to one embodiment of this invention.
Figure 2:
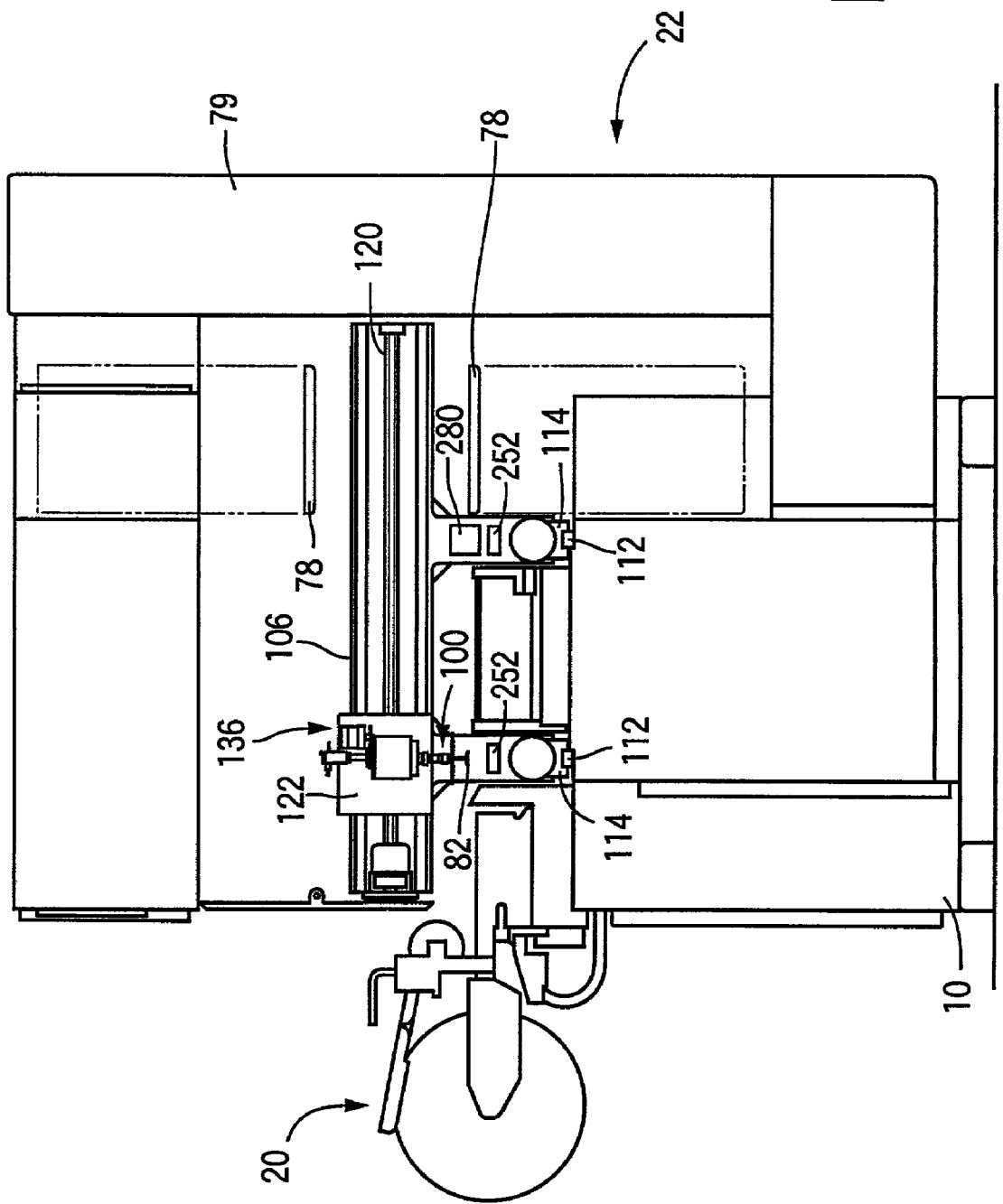
FIG. 2 is a side elevational view of the electronic-component mounting system of FIG. 1.

Referring first to FIGS. 1 and 2, reference numeral 10 denotes a machine base of an electronic-component mounting system. The electronic-component mounting system includes a printed-wiring board conveyor (PWB conveyor) 14, a component mounting device 18 and component supply devices 20, 22, which are mounted on the machine base 10. The PWB conveyor 14 is arranged to transfer a circuit substrate in the form of a printed-wiring board 12 in an X-axis direction (in the left and right directions as seen in FIG. 1). The component mounting device 18 is arranged to mount electric components in the form of electronic components on the printed-wiring board 12. The component supply devices 20, 22 are arranged to supply the component mounting device 18 with the electronic components.

In the present embodiment, the printed-wiring board 12 is transferred by the PWB conveyor 14 such that the printed-wiring board 12 maintains a horizontal attitude or posture. The PWB conveyor 14 is stopped by a suitable stopper device (not shown), to locate the board 12 at a predetermined component-mounting position. The board 12 located at the component-mounting position is supported by a circuit-board support device in the form of a printed-wiring board support device 26 which will be described by reference to FIG. 5. In the present electronic-component mounting system, the printed-wiring board 12 is supported such that a component-mounting surface 28 of the board 12 on which the electronic components are mounted is parallel to the horizontal plane. The above-indicated X-axis direction in which the board 12 is transferred by the PWB conveyor 14 is parallel to an X axis of an XY coordinate system in an XY plane parallel to the horizontal component-mounting surface 28.

Figure 5:
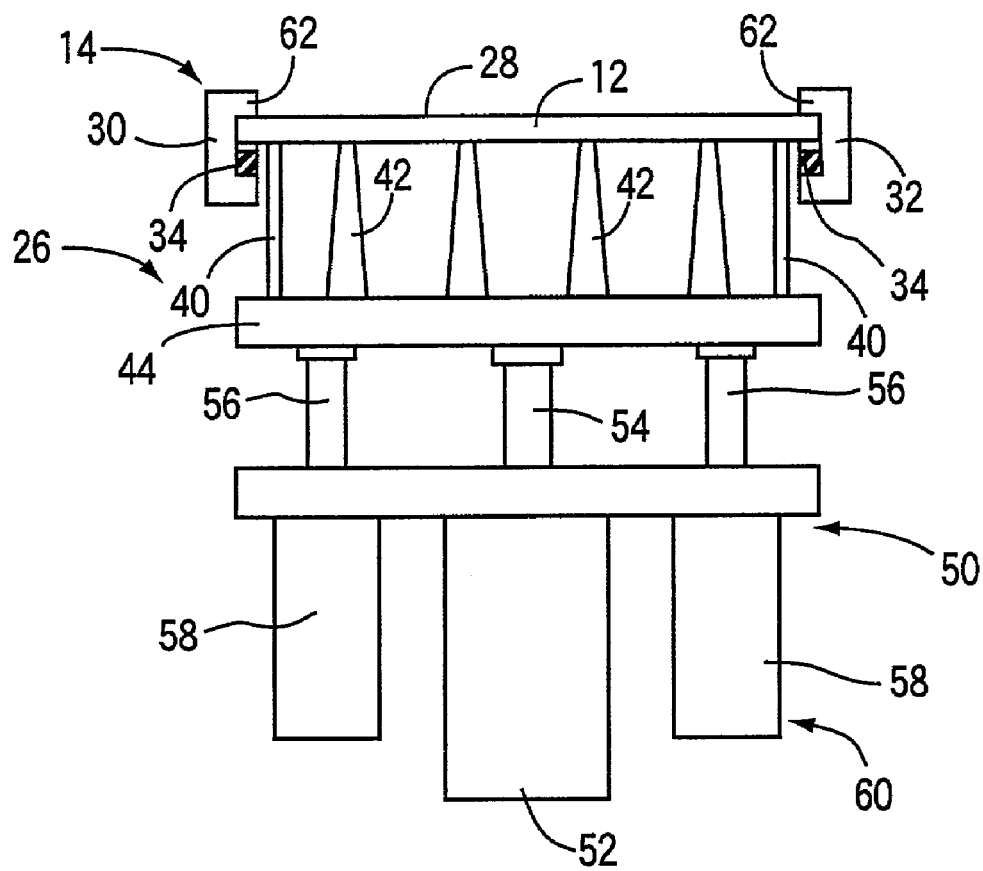
FIG. 5 is a side elevational view, partly in cross section, of a printed-wiring board support device of the electronic-component mounting system.

The printed-wiring board conveyor or PWB conveyor 14 is provided with a pair of guide rails 30, 32, as schematically shown in FIGS. 1 and 5. One of the guide rails 30, 32 is a stationary guide rail fixed on the machine base 10, while the other guide rail is a movable guide rail which is movable toward and away from the stationary guide rail, to change a distance between the stationary and movable guide rails, depending upon the width of the PWB conveyor 14, which is a dimension as measured in a Y-axis direction perpendicular to the X-axis direction in which the PWB conveyor 14 is transferred.

Each of the two guide rails 30, 32 is constructed to guide an endless conveyor belt 34 such that the belt 34 can travel in a hoop. The printed-wiring board 12 is placed on the conveyor belts 34, and is transferred by the conveyor belts 34 when the conveyor belts 34 are rotated in synchronization with each other by a drive source in the form of a printed-wiring board feed motor (PWB feed motor) 36 indicated in the block diagram of FIG. 10.

As schematically shown in FIG. 5, the printed-wiring board support device 26 includes a pair of clamping members 40 and a plurality of supporting members 42. Each of the clamping members 40 takes the form of a plate fixed upright at a corresponding one of opposite ends of an elevator platform 44 such that the two clamping members 40 extend in the X-axis direction, namely, in the direction of movement of the board 12. The plurality of supporting member 42 are fixed upright in an intermediate width portion of the elevator platform 44 which is located intermediate between the two clamping members 40. The elevator platform 44 is located under the printed-wiring board 12 at the predetermined component-mounting position, such that the elevator platform 44 is opposed to the lower surface of the board 12 which is opposite to the component-mounting surface 28 on which the electronic components are mounted by the present electronic-component mounting system.

The elevator platform 44 is lifted and lowered by an elevator drive device 50, which includes a drive source in the form of a fluid-operated actuator such as a fluid-operated cylinder. In the specific example of FIG. 5, the elevator drive device 50 uses, as the drive source, an elevator cylinder 52 which is a pneumatic cylinder. The elevator cylinder 52 is disposed so as to extend in the vertical direction, and includes a piston rod 54 for engagement with the elevator platform 44. The printed-wiring board support device 26 further includes a guiding device 60, which includes two or more sets of guide rods 56 and guide sleeves 58. The guide rod 56 of each set is fixed to the elevator platform 44 and is guided by the corresponding guide sleeve 58. When the piston rod 54 of the elevator cylinder 52 is moved up and down, the elevator platform 44 is lifted and lowered by the piston rod 54 while the elevator platform 44 is guided by the guiding device 60, so that the clamping members 40 and the supporting members 42 are moved perpendicularly to the component-mounting surface 28 of the printed-wiring board 12, in opposite directions toward and away from the board 12. When the elevator platform 44 is placed at its elevated operating position, the clamping members 40 hold the board 12 apart from the upper surfaces of the conveyor belts 34 such that the board 12 is clamped at its opposite ends corresponding to the conveyor belts 34, in pressing contact with the upper ends of the clamping members 40 and hold-down portions 62 provided in the guide rails 30 32, and such that the supporting members 42 support the board 12, with their upper ends held in contact with the lower surface of the board 12.

The component supply devices 20, 22 are spaced from each other in the Y-axis direction perpendicular to the X-axis direction, and located on the opposite sides of the PWB conveyor 14, as shown in FIGS. 1 and 2. In the present embodiment, the component supply device 20 is of tape feeder type, while the component supply device 22 is of tray type. The component supply device 20 of tape feeder type includes a multiplicity of tape feeders 70 which are arranged in the X-axis direction. Each tape feeder 70 has a tape cartridge arranged to feed a carrier tape which accommodates electronic components. The carrier tape includes a carrier substrate which has a multiplicity of component-accommodating recesses formed at a suitable interval along the length of the carrier tape. The electronic components are accommodated in the respective component-accommodating recesses. The opening of each component-accommodating recess is closed by a covering film bonded to the carrier substrate, to prevent the electronic components from moving out of the recesses when the carrier tape is fed. In operation of each tape feeder 70, the carrier tape is fed from the tape cartridge, with a predetermined pitch in the Y-axis direction, while the covering film is separated from a length portion of the carrier substrate which has been fed from the tape cartridge. Thus, the electronic components are fed one after another to a predetermined component-supply position. The electronic components accommodated in the tape feeders 70 include electronic components having leads, and electronic components not having leads.

Figure 3:
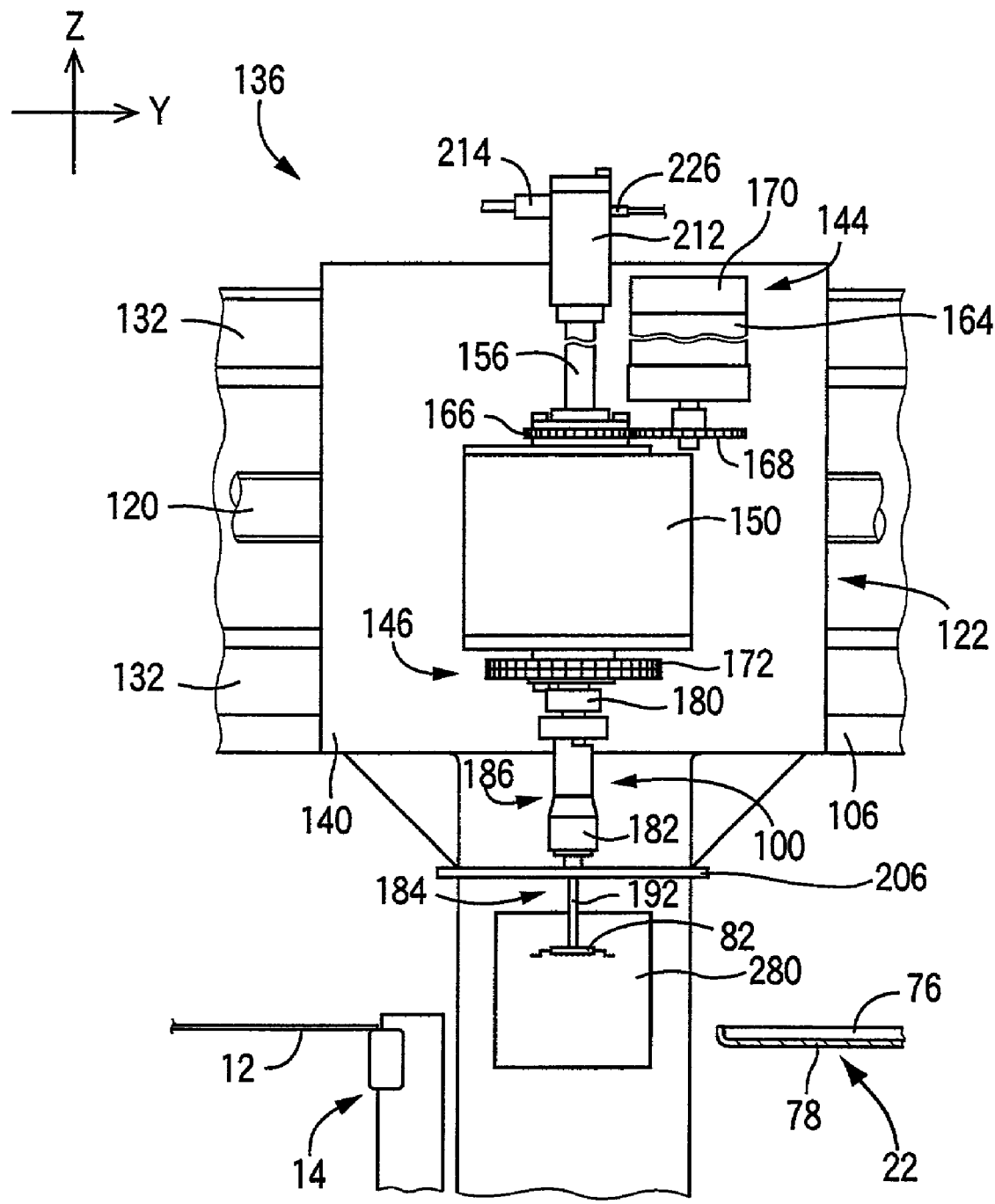
FIG. 3 is a front elevational view showing a component mounting device in the electronic-component mounting system.

The component supply device 22 of tray type includes a multiplicity of component trays 76 (FIGS. 1 and 3) accommodating electronic components. The component trays 76 are accommodated in respective multiple tray boxes 78, which are vertically arranged and are supported by respective support members, not shown. The tray boxes 78 are elevated one after another by an elevator device disposed within a column 79 (FIGS. 1 and 2), to a predetermined component-supply position. For a component holding device 100 (which will be described) of the component mounting device 18 to receive the electronic components from the component tray 76 in the tray box 78 located at the component-supply position, some vertical space must be provided above the component-supply position.

To provide this vertical space, the tray box 78 from which the electronic components have been transferred to the component holding device 100 is moved further upwards from the component-supply position to a predetermined retracted position when the next tray box 78 is moved to the component-supply position, so that the required vertical space is provided between the component-supply position and the retracted position. The component supply device 22 of tray type is identical in construction to a component supply device disclosed in Japanese patent document No. 2-57719, except that each tray box 78 accommodates one component tray 76 only.

Thus, the component mounting device 18 receives electronic components 82 one after another from the component tray 76 in the tray box 78 at the component-supply position above which the required vertical space is provided. Each component tray 76 accommodates the electronic components 82 in component accommodating recesses 80 (FIG. 6) which are arranged in a matrix. Each electronic component 82 accommodated in the corresponding recess 80 is substantially positioned, so that the electronic component 82 can be held at an almost central portion thereof by the component mounting device 18, and can be taken out of the recess 80, while the electronic component almost maintains predetermined attitude and position relative to the component mounting device 18.

Figure 6:
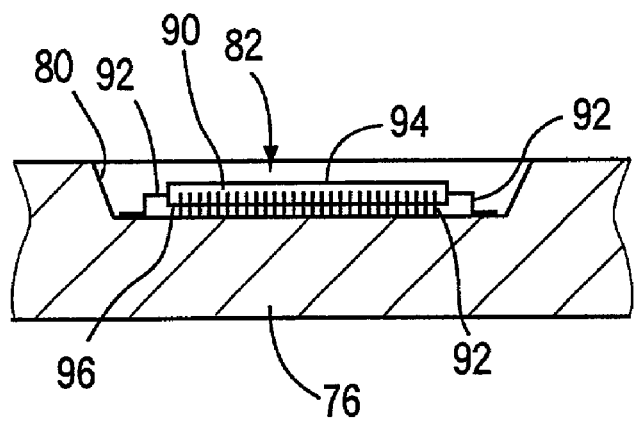
FIG. 6 is a side elevational view, partly in cross section, of a portion of a component tray of a tray-type component-supply device in the electronic-component mounting system.
Figure 7:
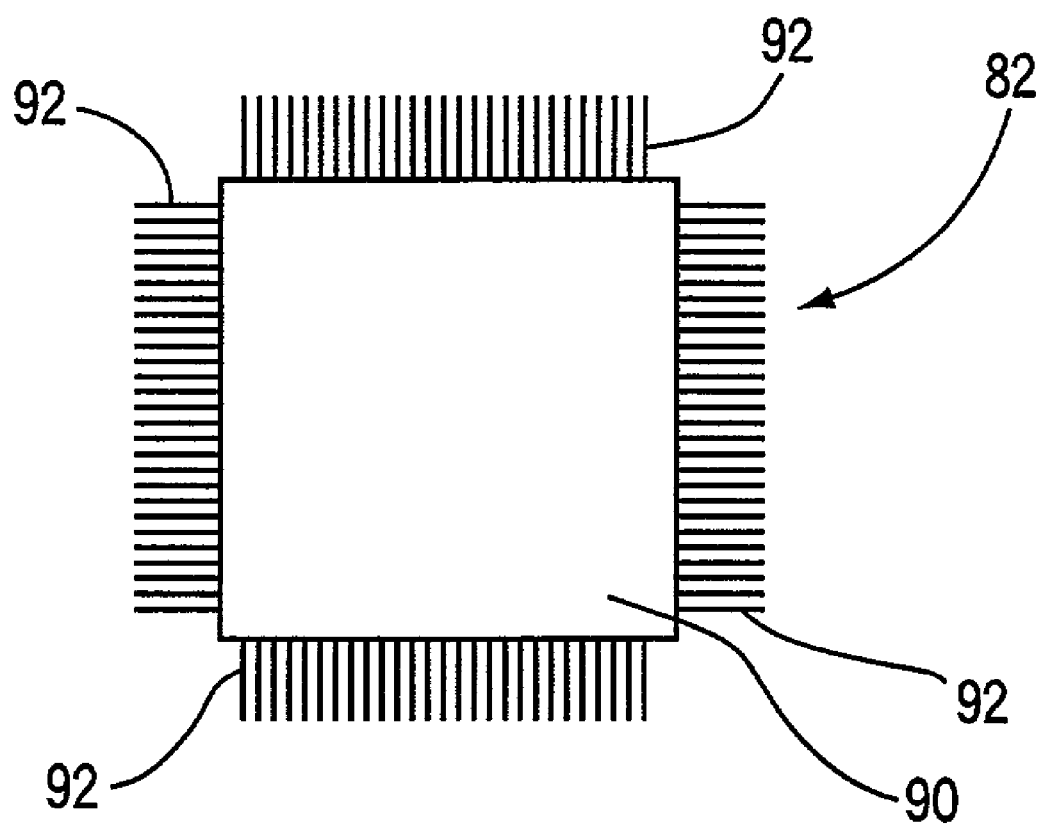
FIG. 7 is a plan view of the electronic component accommodated in the tray.

Each electronic component 82, supplied from the component tray 76, has a considerably large size and includes, as exemplarily illustrated in FIG. 7, a rectangular main body 90 and a plurality of leads 92 extending from four side faces of the rectangular body 90. As shown in FIG. 6, each of the leads 92 extends laterally from the main body 90, such that the each lead 92 includes a base portion laterally extending parallel to a top surface 94 and a bottom surface 96 of the main body 90, an intermediate portion extending vertically downward, and an end portion laterally extending parallel to the top and bottom surfaces 94, 96. The top surface 94 is a surface which is located opposite to the printed-wiring board 12 when the lead 92 is connected to the board 12; and the bottom surface 96 is a surface which is located adjacent to the board 12 when the lead 92 is connected thereto. In the present embodiment, it is assumed, for easier understanding purposes only, that the main body 90 has a square shape in its plan view and an identical number of leads 92 each having an identical length extend from each of the four sides of the square body 90.

Each component accommodating recess 80 opens upward, and has such a transverse-cross-section area or size which assures that the electronic component 82 accommodated therein substantially maintains a predetermined attitude, i.e., a predetermined angular position about an axis line thereof that passes through the center of the main body 90 thereof and is perpendicular to the top and bottom surfaces 94, 96, and that the component 82 is not inclined relative to a plane parallel to the surfaces 94, 96. That is, the transverse-cross-section size of each recess 80 assures that a coplanarity inspection, described later, is carried out on the component 82 without problems.

Next, the component mounting device 18 will be described.

Figure 4:
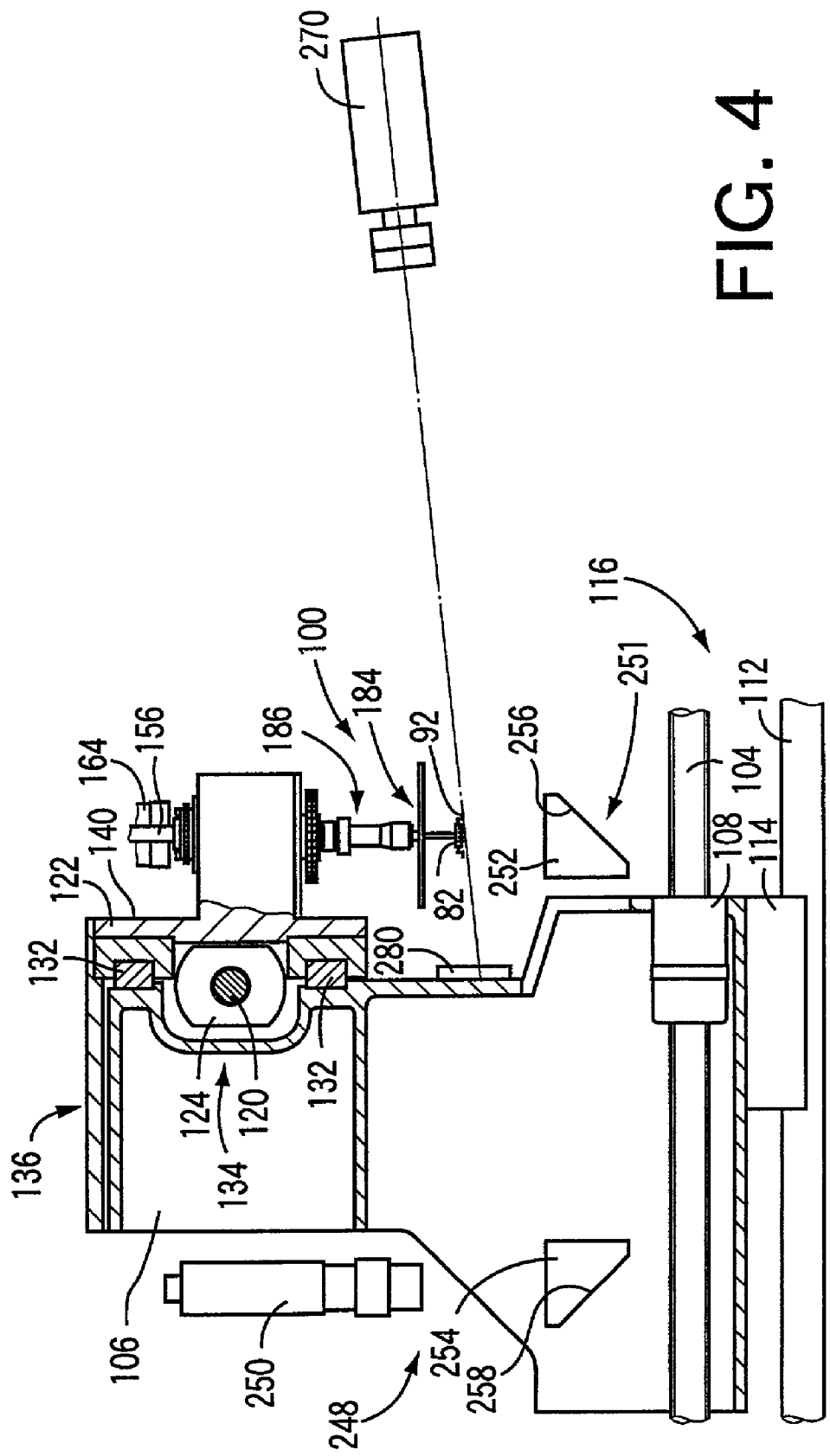
FIG. 4 is a side elevational view, partly in cross section, of the electronic-component mounting system.

The component holding device 100 (FIG. 3) of the component mounting device 18 is movable in the mutually perpendicular X-axis and Y-axis directions, so that the component holding device 100 can take a linear movement having at least one of X-axis and Y-axis components, to move each electronic component 82 to a desired position on or above the component-mounting surface 28 of the printed-wiring board 12. To move the component holding device 100 in the X-axis direction, the component mounting device 18 includes two ballscrews 104 disposed on the machine base 10, on the opposite sides of the PWB conveyor 14, so as to extend in the X-axis direction, as shown in FIG. 1, and an X-axis slide 106 having two bailnuts 108 (only one of which is shown in FIG. 4) which engage the respective ballscrews 104. The device 18 further includes two X-axis drive motors 110 for rotating the ballscrews 104, for moving the X-axis slide 106 in the X-axis direction. As shown in FIG. 1, the X-axis slide 106 extends in the Y-axis direction across the PWB conveyor 14, and has a length corresponding to the distance between the component supply device 20 of feeder type and the component supply device 22 of tray type. On the machine base 10, there are disposed two guide rails 112 (FIG. 4) located under the respective ballscrews 104. The X-axis slide 106 has two guide blocks 114 which slidably engage the guide rails 112, for guiding the X-axis slide 106 in the X-axis direction. It will be understood that the ballscrews 104, ballnuts 108 and X-axis drive motors 110 cooperate with each other to constitute an X-axis drive device 116.

On the X-axis slide 106, there is disposed a ballscrew 120 so as to extend in the Y-axis direction, as shown in FIG. 4. The X-axis slide 106 carries a Y-axis slide 122 having a balinut 124 which engages the baliscrew 120. The baliscrew 120 is rotated by a Y-axis drive motor 126 (FIG. 1) through gears 128, 130, so that the Y-axis slide 122 is moved in the Y-axis direction while being guided by a pair of guide rails 132 (FIG. 4). It will be understood that the baliscrew 120, bailnut 124 and Y-axis drive motor 126 constitute a Y-axis drive device 134, and that the Y-axis drive device 134 cooperates with the X-axis slide 106, X-axis drive device 116 and Y-axis slide 122, to constitute an XY moving device 136 for moving the component holding device 100 to a desired position in the XY plane as a plane parallel to the component-mounting surface 28 of the printed-wiring board 12.

The Y-axis slide 122 has an upright side surface 140 on which there are mounted the above-indicated component holding device 100, a Z-axis drive device 144 for moving up and down the component holding device 100 in a Z-axis direction, and a rotary drive device 146 for rotating the component holding device 100 about its axis. The component holding device 100, the Z-axis drive device 144 and the rotary drive device 146 constitute a component mounting unit. Although the component mounting device 18 in the present electronic-component mounting system includes only one component mounting unit, the electronic-component mounting system may include a plurality of component mounting units. For instance, the two or more component mounting units are disposed on the Y-axis slide 122 such that the units are arranged in a row in the Y-axis direction.

Figure 8:
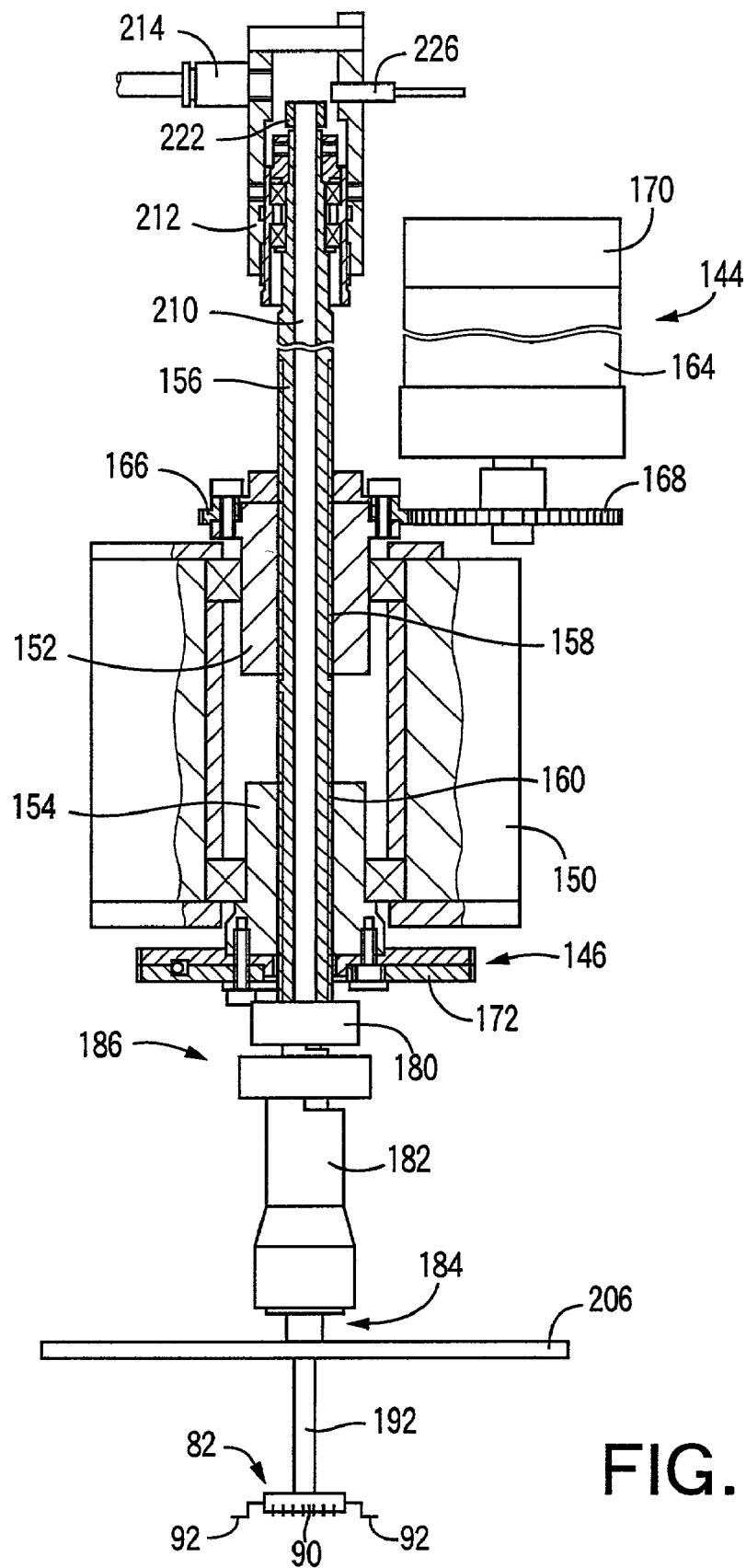
FIG. 8 is a side elevational view, partly in cross section, of a component mounting unit of the component mounting device of FIG. 3.
Figure 9:
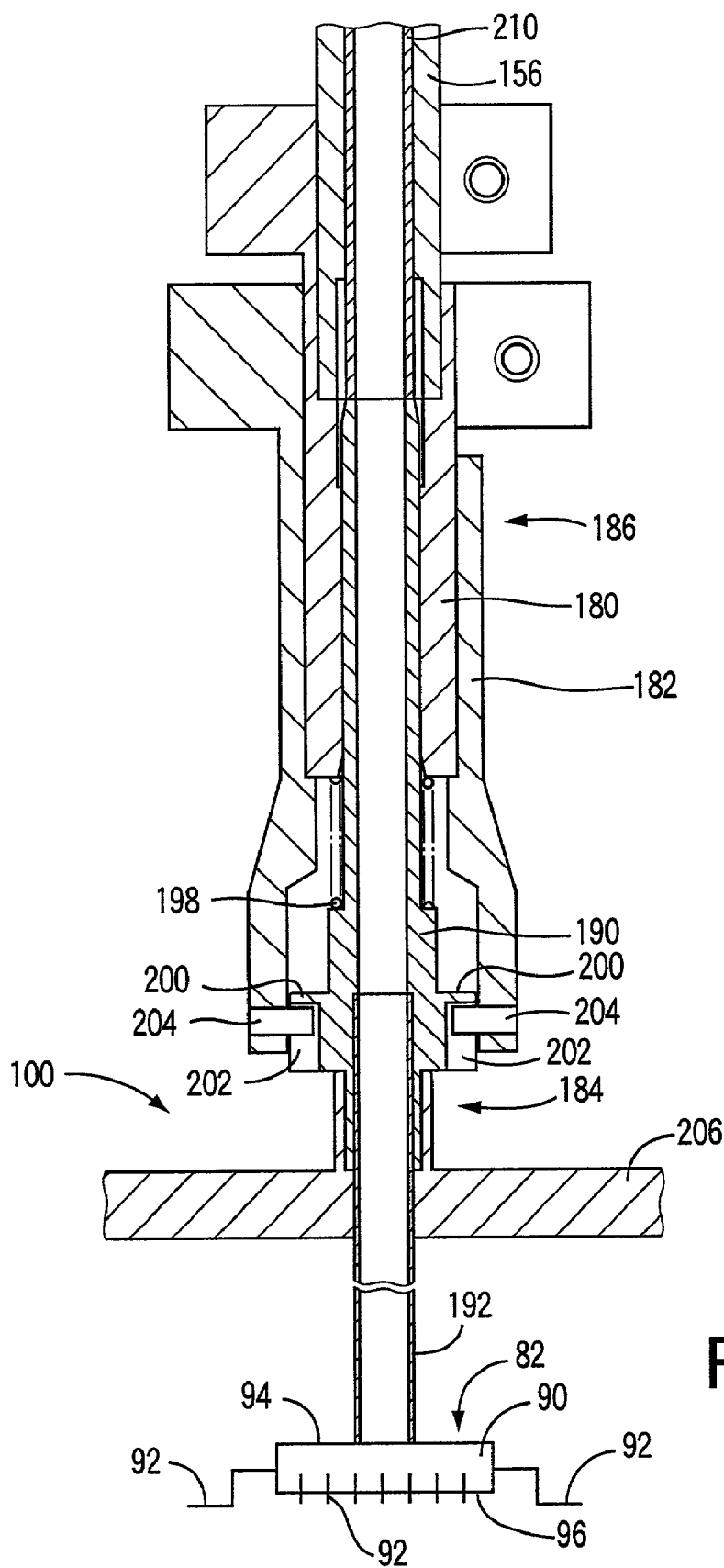
FIG. 9 is a side elevational view, in cross section, of a component holding device of the component mounting unit of FIG. 8.

The component mounting unit in the present embodiment is identical with a component mounting unit as disclosed in Japanese patent document No. 4-372199. The component mounting unit will be described only briefly. The Y-axis slide 122 carries a support portion 150 mounted on the side surface 140. As shown in FIG. 8, the support portion 150 supports a nut 152 and a splined member 154 such that the nut 152 and splined member 154 are coaxial with each other, spaced apart from each other in the axial direction, and rotatable about their axis of rotation extending in the vertical or Z-axis direction. The nut 152 engages an externally threaded portion 158 of a hollow rod 156 while the splined member 154 engages a splined portion 160 of the hollow rod 156. The splined portion 160 is formed below the externally threaded portion 158. The nut 152 and splined member 154 are ballnut and ball-splined member which hold a multiplicity of balls.

The nut 152 is rotated by a rotary drive device including a Z-axis drive motor 164 and gears 166, 168, so that the hollow rod 156 is axially moved, that is, lifted and lowered. Thus, the nut 152, gears 166, 168 and Z-axis drive motor 164 constitute the Z-axis drive device 144. The Z-axis drive device 144 arranged to move the hollow rod 156 in the axial direction functions to move the component holding device 100 in the axial direction, that is, in the Z-axis direction perpendicular to the component-mounting surface 28 of the printed-wiring board 12, so that the component holding device 100 is moved toward and away from the printed-wiring board 12. The amount of operation of the Z-axis drive motor 164 is detected by a rotary encoder 170.

Figure 10:
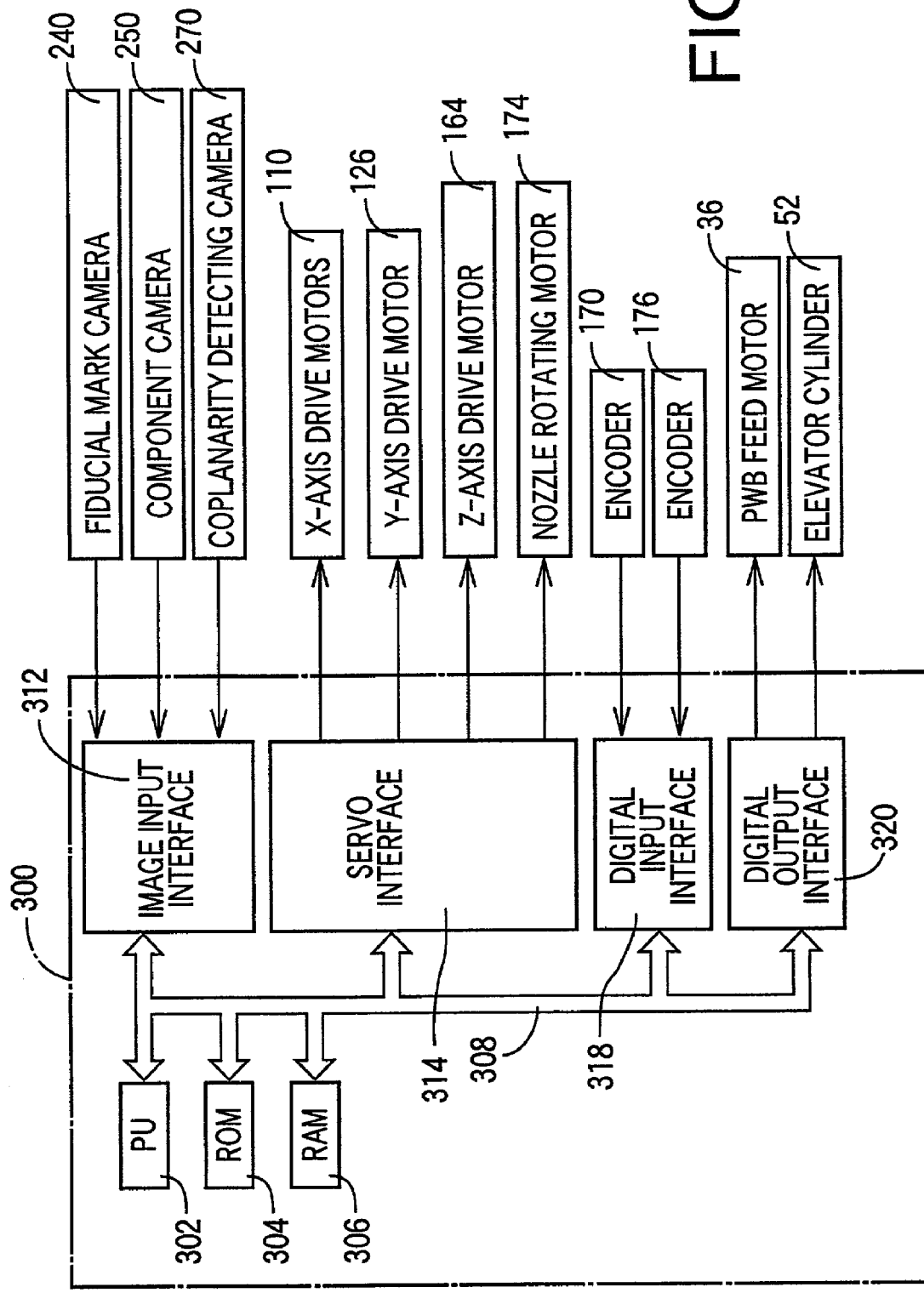
FIG. 10 is a block diagram schematically illustrating a control device of the electronic-component mounting system.

To the lower end portion of the splined member 154 which projects from the support portion 150, there is fixed a gear 172 which meshes with a gear fixed to the output shaft of a nozzle rotating motor 174 (FIG. 10). The hollow rod 156 is rotated about its axis when the splined member 154 is rotated by the nozzle rotating motor 174. Concurrently, the Z-axis drive motor 164 is operated to rotate the nut 152 like the splined member 154, thereby allowing the rotation of the hollow rod 156. Thus, the component holding device 100 is rotatable about its axis so that the electric component 82 held by the component holding device 100 can be rotated about an axis which extends in the vertical direction perpendicular to the top surface 94 of the electronic component 82, through an almost central part of the top surface 94. A rotation angle of the nozzle rotating motor 174 is detected by an encoder 176 (FIG. 10). When the nut 152 is rotated to move the hollow rod 156 in the Z-axis direction, the splined member 154 is kept still while preventing the rotation of the hollow rod 156 and allowing the vertical movement of the same 156.

On the lower end portion of the hollow rod 156, there is removably mounted a chuck adapter 180 on which a chuck 182 is removably mounted, as shown in FIG. 8. The hollow rod 156, chuck adapter 180 and chuck 182 constitute a nozzle holder 186 for removably holding a suction nozzle 184. The nozzle holder 186 and the suction nozzle 184 constitute the component holding device 100.

The suction nozzle 184 has a sleeve 190 and a suction pipe 192 which is partially fitted in the sleeve 190. The sleeve 190 is fitted at its upper portion in the chuck adapter 180 such that the sleeve 190 is biased by a compression coil spring 198 (hereinafter referred to simply as "spring 198") in a direction that causes an exposed lower portion of the sleeve 190 to be moved away from the lower end of the chuck adapter 180. The spring 198 is interposed between the exposed lower portion of the sleeve 190 and the lower end of the chuck adapter 180. The exposed lower portion of the sleeve 190 has a pair of radially extending lugs 200, which are opposed to each other in a diametric direction of the sleeve 190 and which has a pair of slant surfaces 202 lying in the same plane. The chuck 182 has a pair of pins 204 which engage the respective slant surfaces 202, so that the suction nozzle 184 is held by the chuck 182 such that the suction nozzle 184 is not axially movable and not rotatable relative to the chuck 180. The spring 198 serves as biasing means in the form of an elastic member.

A light emitting plate 206 is fixedly mounted on the outer circumferential surface of the lower end portion of the sleeve 190 which is located outside the chuck 182, while the suction pipe 192 is partially fitted in the inner circumferential surface of the lower end portion of the sleeve 190, such that the suction pipe 192 extends downwards through the light emitting plate 206. When the position of the electronic component 82 held by the suction nozzle 184 is detected, the light emitting plate 206 receives an ultraviolet radiation, and generates a visible light toward the component 82.

The suction nozzle 184 is arranged to hold the electronic component 82 by suction under a negative pressure, when the electronic component 82 is mounted on the printed-wiring board 12. To this end, the suction nozzle 184 is connected to a negative pressure source, a positive pressure source and the atmosphere, through: a pipe 210 which is axially movably fitted in the hollow rod 156, as shown in FIG. 8; a housing 212 attached to the upper end portion of the hollow rod 156, such that the housing 212 is rotatable, but not axially movable, relative to the rod 156; a nipple 214 attached to the housing 212; and a solenoid-operated directional control valve (not shown). With a switching action of the solenoid-operated directional control valve, the suction pipe 192 is selectively communicated with one of the negative pressure source, positive pressure source and atmosphere. When a negative pressure is applied from the negative pressure source to the suction pipe 192, the electronic component 82 is held by suction at the top surface 94 of its body 90 by the sucking end of the suction pipe 192. When a positive pressure is applied from the positive pressure source to the suction pipe 192, the electronic component 82 is released from the suction pipe 192. In the present embodiment, the suction nozzle 184 is arranged to hold the electronic component 82 in its horizontal attitude.

The pipe 210 is held, by its own weight, in abutting contact with the upper end face of the sleeve 190 of the suction nozzle 184 which is held by the nozzle holder 186. In this state, the pipe 210 is lifted and lowered with the suction nozzle 184. In the present embodiment, initiation of a relative movement between the nozzle holder 186 and the suction nozzle 184 is detected on the basis of a movement of the pipe 210. To this end, the pipe 210 is provided at its upper end with a reflector dog 222 fixed thereto, and a photoelectric switch 226 is fixedly disposed at an upper portion of the housing 212.

When the component mounting device 18 is not in operation to mount the electronic component 82, the reflector dog 222 is located below the photoelectric switch 226. In the present embodiment, the photoelectric switch 226 is of a reflection type which includes a light emitter and a light receiver and which generates an ON signal when a portion of the light emitted from the light emitter is reflected by the reflector dog 222 and received by the light receiver, and an OFF signal when the light emitted from the light emitter is not reflected by the reflector dog 222 and is not received by the light receiver. When the suction nozzle 184 is located at its lowermost position relative to the nozzle holder 186, therefore, the light emitted from the photoelectric switch 226 is not reflected by the reflector dog 222 and is not received by the photoelectric switch 226, so that the OFF signal is generated. When the suction nozzle 184 is moved upwards by a small distance from the lowermost position toward the nozzle holder 186, the emitted light is reflected by the dog 222, so that the ON signal is generated by the photoelectric switch 226. Thus, the initiation of the relative movement of the suction nozzle 184 and the nozzle holder 186 can be detected by the photoelectric switch 226. In the present embodiment, the pipe 210, reflector dog 222 and photoelectric switch 226 cooperate with each other to constitute a detecting device for detecting the initiation of movement of the suction nozzle 184 relative to the nozzle holder 186.

A plurality of kinds of suction nozzle 184 are used to mount a plurality of kinds of electronic component 82 on the printed-wiring board 12. The different kinds of electronic component 82 usually have different sizes (at least one of the cross sectional area and the height dimension). Depending upon the sizes of the electronic components 82 of different kinds, the different kinds of the suction nozzle 184 whose suction pipes 192 have different diameters are used. Accordingly, the different kinds of the suction nozzle 184 whose suction pipes 192 have the respective different diameters are accommodated in a nozzle storage device, not shown, and are selectively used depending upon the kinds of the electronic components 82 to be mounted on the board 12. The suction pipes 192 having different diameters may have accordingly different lengths. For easier understanding of the present invention, the following description is based on an assumption that the suction pipes 192 of the suction nozzle 184 of different kinds have the same length.

The Y-axis slide 122 further carries a stationary image-taking device in the form of a fiducial mark camera 240 operable to take an image of a fiducial mark provided on the printed-wiring board 12, as shown in FIG. 1. In the present embodiment, the fiducial mark camera 240 is a CCD camera including CCDs (charge-coupled devices) and a lens system and capable of taking, at once, a two-dimensional image of an object. The CCDs are arranged in a two-dimensional matrix, and each CCD generates an electric signal representing an intensity of the light received thereby. An illuminating device 242 is provided to illuminate the fiducial mark on the board 12, and its vicinity, when the image of the fiducial mark is taken by the fiducial mark camera 240.

The X-axis slide 106 is provided with two stationary image-taking devices 248, which are disposed at respective Y-axis positions at which the respective two ballscrews 104 are disposed. Namely, one of the two image-taking devices 248 is located between the component supply device 20 of feeder type and the PWB conveyor 14 (or the printed-wiring board 12 placed thereon), while the other image-taking device 248 is located between the component supply device 22 of tray type and the PWB conveyor 14. The two image-taking devices 248 are identical in construction with each other, and each provide a second image taking device.

Each image-taking device 248 includes, as shown in FIG. 4, a component camera 250 for taking an image of the electronic component 82, and a waveguide device 251. The waveguide device 251 includes a reflecting device in the form of reflecting mirrors 252, 254, which are attached through respective brackets to the underside of the X-axis slide 106. The reflecting mirror 252 is disposed at a position within a path of movement of the component holding device 100 in the Y-axis direction, and has a reflecting surface 256 which is inclined about 45° with respect to a vertical plane including the centerline of the suction nozzle 184, such that one of the opposite ends of the reflecting surface 256 (as viewed in the X-axis direction) which is closer to the X-axis slide 106 is the lower end, that is, the left end of the reflecting surface 256 is the lower end.

The other reflecting mirror 254 is disposed on the side of the X-axis slide 106 which is remote from the reflecting mirror 252, and has a reflecting surface 258 which is inclined with respect to the vertical plane, symmetrically with the reflecting surface 256. The component camera 250 for taking the image of the electronic component 82 held by the suction nozzle 184 is located on the side of the X-axis slide 106 remote from the component holding device 100, such that the component camera 250 faces downwards toward the reflecting surface 258 of the reflecting mirror 254. In this arrangement, the image of the electronic component 82 held by the suction nozzle 184 can be taken by the component camera 250 when the component holding device 100 is moved by the XY positioning device 136 to the Y-axis position of the corresponding ballscrew 104 at which the electronic component 82 is located right above the reflecting mirror 252. Thus, the image-taking device 248 is arranged to image the electronic component 82 located at a predetermined image-taking position which lies within a path of movement of the electronic component 82 when the Y-axis slide 122 is moved in the Y-axis direction relative to the X-axis slide 106. In the present embodiment, the component camera 250 is a two-dimensional CCD camera, like the fiducial mark camera 240 described above.

A UV irradiating device, not shown, is disposed near the reflecting mirror 252, for irradiating the light emitting plate 206 of the suction nozzle 184 with an ultraviolet radiation. The light emitting plate 206 absorbs the ultraviolet radiation, and emits a visible light for illuminating the top surface 94 of the electronic component 82 held by the suction nozzle 184. The component camera 250 takes a silhouette image of the electronic component 82 in the axial direction of the suction nozzle 184, with the light emitting plate 206 used as a light background. In the present embodiment, the light emitting plate 206 and the UV irradiating device cooperate to constitute an illuminating device for the image-taking device 248.

Figure 14:
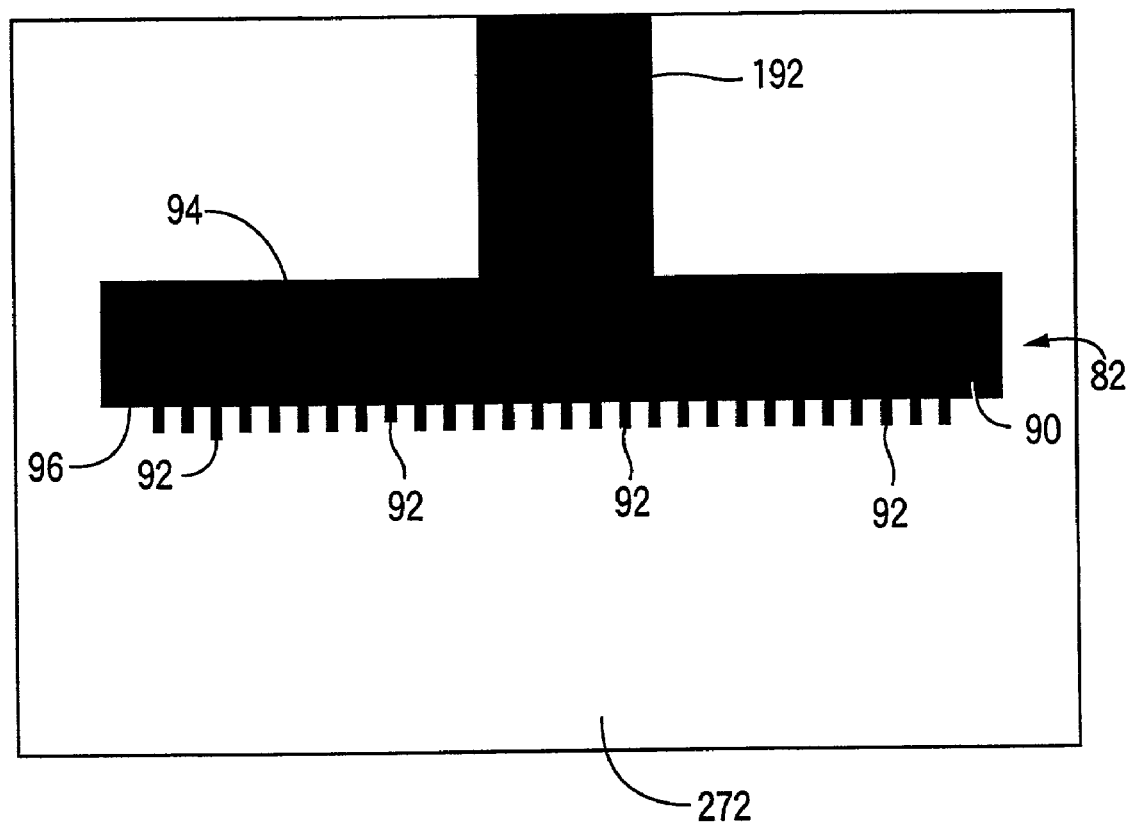
FIG. 14 is a view of an image of an electronic component taken by a coplanarity detecting camera of the electronic-component mounting system.

As shown in FIG. 1, a coplanarity detecting camera 270 is fixedly supported by a support member, not shown, at a position corresponding to one of the two baliscrews 104 that is provided, on the machine base 10, between the tray-type component supply device 22 and the board support device 26. The coplanarity detecting camera 270 provides a first image taking device. In the present embodiment, the coplanarity detecting camera 270 is provided by a CCD camera including a matrix of CCDs that defines an image taking surface 272 (FIG. 14). Thus, the coplanarity detecting camera 270 functions as a surface-image taking device capable of taking, at once, a two-dimensional image of the electronic component 82.

As shown in FIGS. 1 and 4, the coplanarity detecting camera 270 faces, toward the electronic component 82 held by the suction nozzle 184, at a position away from the tray-type component supply device 22 in the X-axis direction perpendicular to the Y-axis direction in which the component supply device 22 and the PWB conveyor 14 are arranged. An optical axis of the camera 270 is parallel to the X-axis direction, but is inclined by a predetermined angle (e.g., 6 degrees) relative to the bottom surface 96 of the main body 90 of the component 82 such that in a direction toward the component 82, the optical axis goes down. The coplanarity detecting camera 270 is aligned, in the Y-axis direction, with one of the image taking devices 248 that corresponds to the tray-type component supply device 22.

Thus, in a state in which the EC 82 is positioned in the Y-axis direction at a position corresponding the ballscrew 104 between the tray-type component supply device 22 and the PWB conveyor 14, the coplanarity detecting camera 270 can take an image of the EC 82, irrespective of which position the electronic component 82 may take in the X-axis direction. Thus, like the image taking device 248, the coplanarity detecting camera 270 is provided at the position where the camera 270 can take an image of the component 82 on a path of movement thereof caused by the movement of the Y-axis slide 122 relative to the X-axis slide 106. In the present embodiment, the image taking device 248 and the coplanarity detecting camera 270 are provided at the respective positions where the image taking device 248 and the coplanarity detecting camera 270 can take respective images of the component 82 positioned right above the reflection mirror 252 of the image taking device 248, provided at the position corresponding to the baliscrew 104 provided between the tray-type component supply device 22 and the PWB conveyor 14. As will be described later, the electronic component 82 is moved via the shortest way from the component-supply position of the tray-type component supply device 22 to a component-mounting place on the printed-wiring board 12. During this movement, the component 82 is stopped so that an image of the component 82 is taken by the coplanarity detecting camera 270. Thus, respective images of different electronic components 82 are taken at different positions by the camera 270. However, the focal point of the camera 270 is adjusted according to an X-axis-direction position of each electronic component 82 at a time when an image of the component 82 is taken by the camera 270.

A flat light emitter 280 is fixed to the X-axis slide 106, at a height position between the Y-axis slide 122 and the waveguide device 251 of the image taking device 248, and at a position opposite to the coplanarity detecting camera 270 with respect to the electronic component 82 held by the suction nozzle 184. The flat light emitter 280 provides a background-forming device. The flat light emitter 280 includes a number of light emitting diodes arranged in a plane, and a diffusion plate that diffuses the light emitted by the diodes. Alternatively, the flat light emitter 280 may be provided by respective end portions of optical fibers that are arranged in a plane. The light emitter 280 emits a light toward the electronic component 82 and the coplanarity detecting camera 270. In FIG. 2, the camera 270 is not illustrated.

The present electronic-component mounting system is provided with control means in the form of a control device 300 illustrated in FIG. 10. The control device 300 is principally constituted by a computer incorporating a processing unit (PU) 302, a read-only memory (ROM) 304, a random-access memory (RAM) 306, and a bus 308 interconnecting those elements 302, 304, 306. The bus 308 is connected to an image input interface 312 to which are connected the fiducial mark camera 240, component cameras 250, and the coplanarity detecting camera 270 which have been described above. The bus 308 is also connected to a servo interface 314 to which are connected various actuators such as the X-axis drive motors 110, Y-axis drive motor 126, Z-axis drive motor 164 and nozzle rotating motor 174. In the present embodiment, the X-axis drive motors 110 are servo motors. However, the X-axis drive motors may be electric motors of other types such as stepping motors, as long as the amount of operation of the electric motors can be controlled.

The bus 308 is also connected to a digital input interface 318 and a digital output interface 320. To the digital input interface 318, there are connected the encoders 170, 176 described above, and other encoders such as those for detecting the amount of operation of the X-axis drive motors 110. To the digital output interface 320, there are connected the printed-wiring board feed motor (PWB feed motor) 36, a control valve for the elevator cylinder 52, and other actuators. The RAM 306 stores various control programs such as those for executing a main control routine, an electronic-component mounting routine, and a coplanarity detecting routine. The control device 300 also controls operations of the fiducial mark camera 240, the image-taking devices 248, and the coplanarity detecting camera 270. The computer drives the respective motors 110, 126, 164, 174 via respective drive circuits, not shown, and controls the respective cameras 240, 250, 270 via respective control circuits. Those drive circuits and those control circuits cooperate with the computer to provide the control device 300.

Next, there will be described an operation of the present electronic-component mounting system. Basic steps of an operation for mounting electronic components 82 on a printed-wiring board 12 are well known in the art, and are disclosed in, e.g., Japanese patent No. 2,824,378. Hence, first, those basic steps will be described briefly, and then steps relevant to the present invention will be described in detail.

When electronic components 82 are mounted on a printed-wiring board 12, first, the board 12 is carried in by the PWB conveyor 14, and is stopped at the component mounting position by a stopper, not shown. Then, the clamping members 40 and the support members 42 are lifted up, so that the printed-wiring board 12 is clamped and supported.

In the above-explained state, the fiducial mark camera 240 is moved by the moving device 136, to take respective images of fiducial marks, not shown, provided on the printed-wiring board 12. Then, the control device 300 processes image data representing the images of the fiducial marks, taken by the camera 240, and thereby determines positional errors of the board 12 and accordingly an X-axis-direction error ΔX' and a Y-axis-direction error ΔY' of each of predetermined component-mounting places on the board 12.

Then, electronic components 82, such as an electronic component shown in FIG. 7, are mounted on the printed-wiring board 12. To this end, the component holding device 100 is moved, by the movements of the X-axis slide 106 and the Y-axis slide 122, to the component-supply position of the feeder-type component supply device 20 or the tray-type component supply device 22, so that the holding device 100 holds an electronic component 82. An image of the component 82 held by the holding device 100 is taken, and the control device 300 determines, based on the taken image, positional errors of the component 82 held by the suction nozzle 184, and operates for mounting the component 82 on the board 12 while eliminating the positional errors. In the present embodiment, each of the electronic components 82 supplied from the tray-type component supply device 22 is additionally subjected to a lead-coplanarity inspection. Hence, the manner in which each electronic component 82 supplied from the tray-type component supply device 22 is mounted on the printed-wiring board 12 will be described in detail, below.

When each electronic component 82 is mounted on the printed-wiring board 12, respective end portions of the leads 92 of the component 82 are placed on a printed circuit provided on the component-mounting surface 28 of the board 12. Therefore, if there is one or more leads 92 that are largely deformed upward, i.e., toward the top surface 94 of the main body 90, or downward, i.e., toward the bottom surface 96, some leads 92 cannot contact the printed circuit. To avoid this, a coplanarity of the leads 92 is detected, and it is judged, based on the detected coplanarity, whether the electronic component 82 may be mounted on the printed-wiring board 12.

Each electronic component 82 supplied from the tray-type component supply device 22 is mounted on the printed-wiring board 12, as follows: First, the component holding device 100 is moved by the moving device 136 to the tray-type component supply device 22, and holds the component 82 by suction. Subsequently, on a way to the board 12, the holding device 100 is stopped at the position right above the reflecting mirror 252 of the image taking device 248 provided between the tray-type supply device 22 and the PWB conveyor 14, so that first an image of the component 82 is taken by the coplanarity taking camera 270.

In the present embodiment, the main body 90 of the electronic component 82 has a square shape in its plane view, and has four identical sides from each of which a predetermined number of leads 92 extend. Therefore, each time an image of one side of the component 82 is taken, the component 82 is rotated by 90 degrees about its axis line. That is, the four sides of the component 82 are sequentially positioned at an image-taking angular position where each of the four sides extends substantially parallel to the Y-axis direction and substantially perpendicularly to the optical axis of the coplanarity detecting camera 270, at a position between the axis line of the component 82 and the camera 270. After respective images of the four sides of the component 82 are taken, the control device 300 processes four sets of image data representing the four images taken by the camera 270, and detects a coplanarity of the leads 92 of the component 82.

Based on the thus detected coplanarity of the leads 92, the control device 300 judges whether the electronic component 82 is acceptable, i.e., should be passed to be mounted on the printed-wiring board 12. More specifically described, the control device 300 judges whether respective end portions of the leads 92 are substantially aligned with each other in a single plane, i.e., whether the component 82 can be placed and mounted on the board 12 such that all the leads 92 substantially uniformly contact the board 12. If it is judged that the component 82 is acceptable, an image of the component 82 is additionally taken by the component camera 250, and the control device 300 determines, based on the thus taken image, positional errors of the component 82 held by the suction nozzle 184. In the present embodiment, the positional errors of the component 82 include positional errors of the component 82 relative to the component holding device 100 in directions parallel to the top surface 94, and an angular-positional error of the component 82 about the axis line of rotation thereof. The component 82 is mounted on the board 12, while those positional errors are eliminated. Thus, the component 82 is mounted, on the board 12, at a correct component-mounting place and at a correct angular position. On the other hand, if the detected coplanarity of the leads 92 of the component 82 is too low, the control device 300 judges that the component 82 is not acceptable, and discards the component 82 without mounting it on the board 12.

Next, there will be described the operation of the present electronic-component mounting system by reference to the flow charts of FIGS. 11 and 12.

Figure 11:
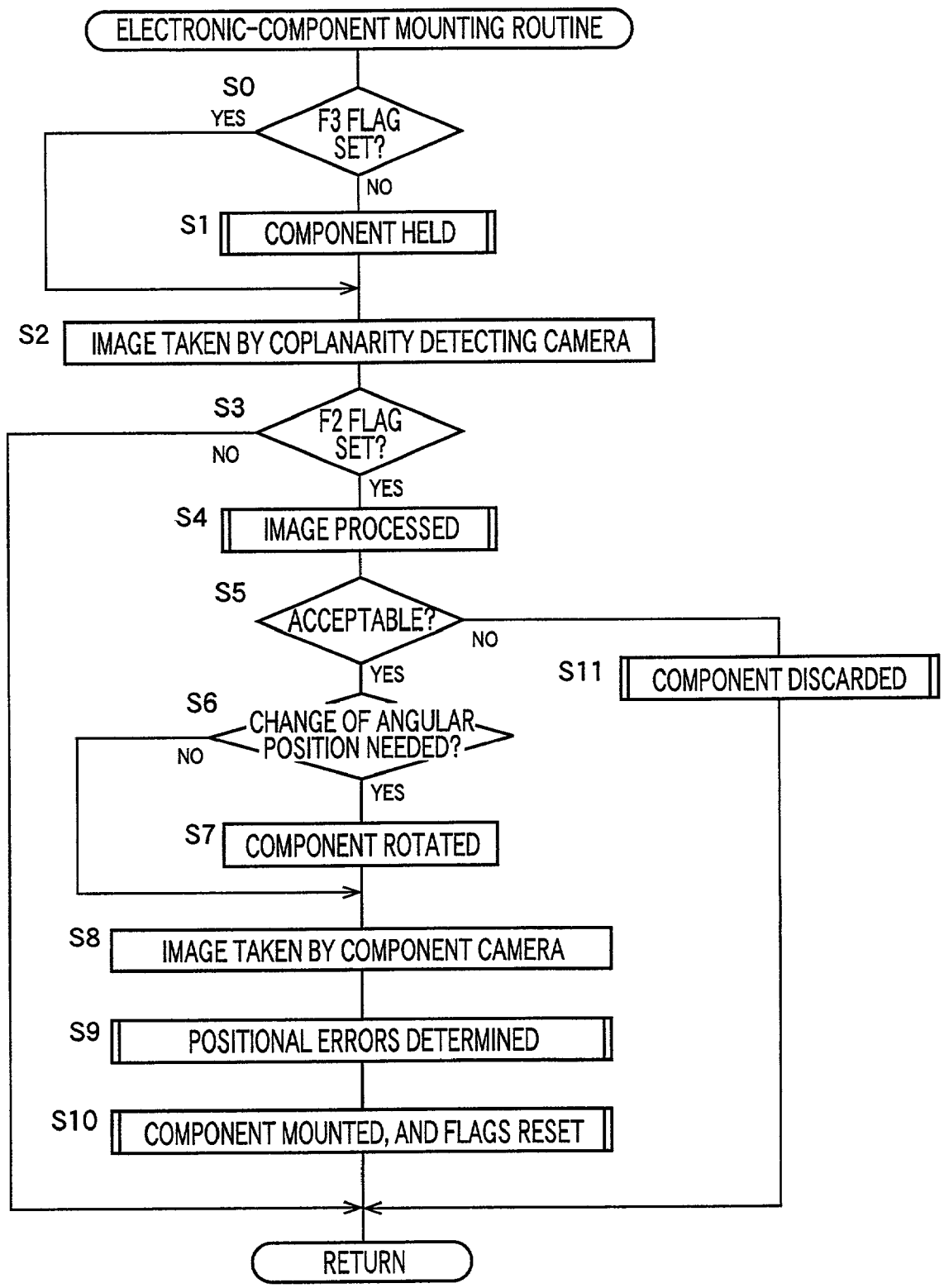
FIG. 11 is a flow chart representing an electronic-component mounting routine that is stored in a RAM (random access memory) of a computer in the control device of FIG. 10.
Figure 12:
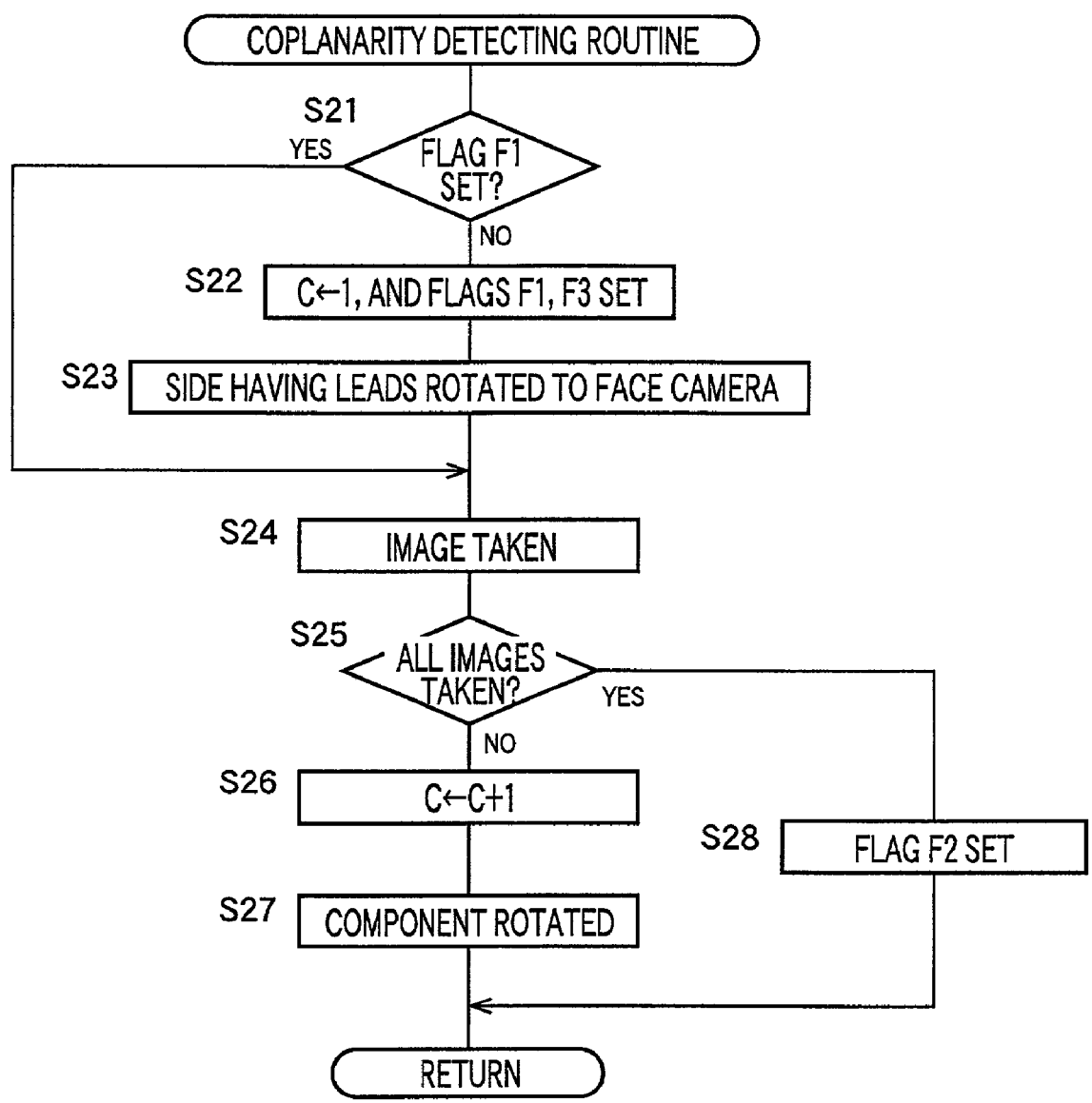
FIG. 12 is a flow chart representing a coplanarity detecting routine that is stored in the RAM of the computer.

First, at Step S0 of the electronic-component mounting routine of FIG. 11, the control device 300 judges whether flag F3 is set ON, indicating that an electronic component 82 is held by the suction nozzle 184. Since the F3 flag is initially reset to OFF according to the main routine, a negative judgment is made at Step S0. Accordingly, the control goes to Step S1 to operate the suction nozzle 184 to hold an electronic component 82. More specifically described, the component holding device 100 is moved by the moving device 136, so that the suction nozzle 184 is moved to a position right above one of a number of electronic components 82 stored in the component tray 76 that is to be picked up. Then, the nozzle 184 is lowered by the Z-axis drive device 144, so that the suction pipe 192 contacts the electronic component 82 and the suction supplied to the nozzle 184 is applied to the top surface 94 of the component 82. Thus, the nozzle 184 holds the component 82. Thereafter, the nozzle 184 is lifted up to take the component 82 out of the tray 76, and is moved by the moving device 136 toward the printed-wiring board 12. During this movement, the nozzle 184 is stopped so that an image of the component 82 is taken.

The component holding device 100 holding the electronic component 82 is moved along a straight line connecting between the component accommodating recess 80 in which the component 82 was present, and a component-mounting place on the printed-wiring board 12, toward a position right above the component-mounting place. During this movement, the holding device 100 is moved over the reflecting mirror 252 fixed at a position between the recess 80, i.e., the component-supply position of the tray-type component-supply device 22 and the component-mounting place.

Irrespective of where the component-supply position may be in the tray-type component-supply device 22 or the component-mounting place may be on the printed-wiring board 12, the component holding device 100 must be moved, in the Y-axis direction on the X-axis slide 106, over a position between the supply device 22 and the board 12, in order to transfer the electronic component 82 from the component-supply position to the component-mounting place. Therefore, the holding device 100 must be moved over a portion of the X-axis slide 106 that is located between the supply device 22 and the board 12, or the reflecting mirror 252 fixed to that portion and positioned between the component-supply position and the component-mounting place, or the Y-axis-direction position where the coplanarity detecting camera 270 is aligned with the image taking device 248 and can take an image of the component 82 held by the holding device 100. Thus, the control device 300 carries out Step S2 where the coplanarity detecting camera 270 takes an image of the component 82 held by the holding device 100. Since the component 82 is necessarily moved over the reflecting mirror 252 during the movement from the supply device 22 toward the board 12, that is, through the position where the coplanarity detecting camera 270 takes an image of the component 82, the component 82 can be moved, in the present embodiment, over the shortest possible distance from the component-supply position to the component-mounting place by the moving device 136.

When the component holding device 100 is moved to the position right above the reflecting mirror 252, the holding device 100 is stopped, so that an image of the electronic component 82 held by the suction nozzle 184 is taken by the coplanarity detecting camera 270. Next, the manner in which the camera 270 takes an image of the component 82 will be described by reference to the coplanarity detecting routine of FIG. 12.

At Step S21 of the coplanarity detecting routine, the control device 300 judges whether flag F1 is set ON, indicating that a number, C, that is counted by a counter and represents a number of image-taking operations corresponding to a number of sides of the main body 90 of the electronic component 82 from which the leads 92 extend, is set at one (i.e., C=1). Flag F1, counter, flag F2 (described later), and flag F3 (described above) are provided in the RAM 306. Flag F1 was initially reset OFF according to the main routine, and accordingly a negative judgment is made at S21, so that the control goes to S22 where the control device 300 sets the counted number C to one (C=1) and sets flags F1, F3 to ON.

Step S22 is followed by Step S23 to rotate the electronic component 82 so that one of the sides of the component 82 from which the leads 92 extend is positioned at the image-taking angular position. However, the leads 92 extend from each of the sides of the component 82. Therefore, when the component 82 held by the suction nozzle 184 is moved to the image-taking angular position, one of the sides from which the leads 92 extend is naturally positioned at the image-taking angular position. Therefore, in this special case, the component 82 is not rotated at Step S23.

For example, in the case where an electronic component having leads extending from only one of a plurality of sides thereof, is transferred to a position right above the reflecting mirror 252, the side from which the leads extend may not be naturally positioned at the image-taking angular position. Then, at Step S23, the component is rotated so that the side having the leads is positioned at the image-taking angular position. The control device 300 can judge whether it is needed to rotate each electronic component at Step S23, based on an angular position taken by the each component accommodated in the component tray 76 and information representing which side or sides of the each component have leads.

Then, the control goes to Step S24 where the coplanarity detecting camera 270 takes an image of the electronic component 82. As shown in FIG. 14, the image taken by the camera 270 consists of a dark image of the suction pipe 192, the main body 90, and the leads 92 projected in a light background formed by the light emitted by the flat light emitter 280. As described above, the optical axis of the coplanarity detecting camera 270 is inclined relative to the bottom surface 96 of the main body 90 such that the optical axis goes down in a direction toward the main body 90. Therefore, the camera 270 can take a clear image of respective end portions of the leads 92 that are not overlapped by the main body 90 or respective base portions of the leads 92. In addition, since the flat light emitter 280 emits light toward the component 82 and the camera 270 from the side opposite to the camera 270, the dark image of the leads 92 can be taken in good contrast to the light background. Moreover, the camera 270 is effectively prevented from taking an image of the leads 92 extending from the side opposite to the side positioned at the image-taking angular position. In FIG. 14, the same reference numerals as used to designate the leads 92, main body 90, etc are used to designate respective dark images of the same 92, 90, etc.

Step S24 is followed by Step S25 to judge whether all the image-taking operations have been carried out, i.e., whether the same number of image-taking operations as the number of the sides of the electronic component 82 from which the leads 92 extend have been finished. The number of the image-taking operations is counted by the counter. Regarding the component 82, the control device 300 judges whether the counted number C is equal to four. The number of one or more sides of each electronic component from which leads extend, the intermittent rotation angle or amount needed to position each side of the each component at the image-taking angular position, the angular position (about an axis line of the each component) at which the each component is to be mounted, etc. are stored, in the RAM 306, in association with the specific kind of the each component.

Negative judgments are made at Step S25 till the same number of image-taking operations as the number of the sides of the electronic component 82 from which the leads 92 extend are carried out. In those cases, the control goes to Step S26 to add one to the counted number C, and then to Step S27 to rotate the component 82 so that another side having the leads 92 whose image is to be taken next is positioned at the image-taking angular position.

In the present embodiment, the main body 90 of the electronic component 82 has a square shape in its plan view, and accordingly has four sides. Therefore, after an image of the leads of one side is finished, the component 82 is rotated by 90 degrees by the rotating device 146, so that an image of the leads 92 of another side adjacent to the current side is taken.

Steps S21 and S24 to S27 are repeated till the same number of image-taking operations as the number of the sides of the electronic component 82 from which the leads 92 extend are finished. Since flag F3 is set ON, Step S0 of the electronic-component mounting routine is interfaced to Step S2 while Step S1 is skipped, i.e., another electronic component 82 is not held. At Step S3 of the electronic-component mounting routine, the control device 300 judges whether flag F2 is set ON and thereby judges whether the coplanarity detecting camera 270 has finished all the image-taking operations. Negative judgments are made at Step S3 till the last image-taking operation is finished. In those cases, the control device 300 quits the routine of FIG. 11.

If a positive judgment is made at Step S25, the control proceeds with Step S28 to reset the number C counted by counter, to zero, and set flag F2 to ON. Thus, the routine of FIG. 12 is finished. Flag F2 being set ON indicates that the coplanarity detecting camera 270 has taken all the necessary images of the electronic component 82.

Thus, a positive judgment is made at Step S3, and the control goes to Step S4 where the control device 300 processes respective sets of image data representing the respective images taken by the coplanarity detecting camera 270. In the present embodiment, the control device 300 determines, by processing the sets of image data, respective lengths of respective images of the leads 92 formed in the image-taking surface 272 of the camera 270, i.e., respective lengths of respective portions of the leads 92 that extend from the main body 90. The processing of each set of image data may be carried out according to the technique of pattern matching disclosed in Japanese patent document No. 8-180,191 or its corresponding U.S. Pat. No. 5,754,677.

Step S4 is followed by Step S5 to judge whether the electronic component 82 is acceptable. In the present embodiment, the control device 300 first determines, for each of the four sides of the component 82, a regression line that is least deviated from the respective lengths of the leads 92 extending from the each side, according to, e.g., least-square method, and then judges whether an amount of deviation of each of the respective lengths of the leads 92 from the regression line is smaller than a predetermined value. Here, it is assumed that the leads 92 extending from each side are correctly spaced from one another at a regular interval.

As shown in FIG. 14, if a lead 92 is deformed upward, i.e., toward the top surface 94 of the main body 90, a length of the lead 92 is shortened; and if a lead 92 is deformed downward, i.e., toward the bottom surface 96, a length of the lead 92 is lengthened. In the former case, a reference value $\Delta$ L1 is used in judging whether an amount of deviation of the length of the lead 92 is permissible; and in the latter case, a reference value $\Delta$ L2 that is equal to the reference value $\Delta$ L1 in the present embodiment is used in judging whether an amount of deviation of the length of the lead 92 is permissible. Since the optical axis of the coplanarity detecting camera 270 is inclined, respective length of the leads 92 are lengthened as such. This is taken into consideration in determining the reference values $\Delta$ L1, $\Delta$ L2.

Starting with an arbitrary one of the four sides of the electronic component 82, the control device 300 sequentially determines an amount by, and a direction in, which the length of each of the leads 92 extending from each of the four sides is deviated from the regression line determined for the each side, and compares the thus determined deviation amount and direction with an appropriate one of the reference values $\Delta$ L1, $\Delta$ L2. Irrespective of in which direction a lead 92 may be deformed, an upward direction or a downward direction, if an amount of deviation of the lead 92 is judged as being greater than the appropriate reference value $\Delta$ L1, $\Delta$ L2, then the control device 300 does not inspect, any longer, the respective lengths of the remaining leads 92. That is, the control device 300 judges that the coplanarity of the leads 92 of the component 82 is too low to be mounted on the printed-wiring board 12 and accordingly is not acceptable.

If the amount of deviation of each of the respective lengths of all the leads 92 of the electronic component 82 is judged as being smaller than an appropriate one of the reference values $\Delta$ L1, $\Delta$ L2, then the control device 300 additionally judges whether a coplanarity among the four groups of leads 92 corresponding to the four sides of the component 82 is acceptable. Though the main body 90 of the component 82 may be more or less inclined relative to the component-mounting surface 28 when the component 82 is mounted on the board 12, the leads 92 can be suitably connected to the electric circuits provided on the board 12, if the leads 92 are substantially uniformly placed on the board 12. In the present embodiment, this judgment is made by first determining a virtual plane that is least deviated from the four regression lines determined for the four sides of the component 82, then determining an amount by, and a direction in, which each of the four regression lines is deviated from the virtual plane, and finally comparing the thus determined deviation amount and direction with an appropriate one of two reference values that are predetermined for two possible deviation directions and are, in the present embodiment, equal to each other. If the amount of deviation of each of the regression lines is smaller than an appropriate one of the two reference values, the control device 300 judges that the coplanarity of all the leads 92 of the component 82 is acceptable. On the other hand, if the amount of deviation of at least one of the regression lines is not smaller than an appropriate one of the two reference values, the control device 300 judges that the coplanarity of all the leads 92 is not acceptable.

If the coplanarity of each of the leads 92 relative to a corresponding one of the regression lines is acceptable and simultaneously the coplanarity of each of the regression lines relative to the virtual plane is acceptable, that is, if the electronic component 82 is acceptable, a positive judgment is made at Step S5, so that the control goes to Step S6 where the control device 300 judges whether the current angular position of the component 82 needs to be changed, i.e., whether the angular position of the component 82 at the time when all the necessary images of the component 82 are taken by the coplanarity detecting camera 270 is the same as that at which the component 82 is to be mounted on the printed-wiring board 12.

If the angular position of the electronic component 82 when all the images of the component 82 are taken by the coplanarity detecting camera 270 is the same as that at which the component 82 is to be mounted on the printed-wiring board 12, the current angular position of the component 82 need not be changed, and accordingly a negative judgment is made at Step S6, so that the control goes to Step S8. On the other hand, if not, a positive judgment is made at Step S6, and the control goes to Step S7 to operate the nozzle rotating device 146 to rotate the suction nozzle 184 and thereby rotate the component 82 about its axis line. Thus, the current angular position of the component 82 is made equal to that at which the component 82 is to be mounted on the board 12.

For example, in the case where an electronic component 82 is mounted, on the printed-wiring board 12, at an angular position different from that at which the component 82 is held by the suction nozzle 184, if the angular position of the component 82 is changed, during the coplanarity detecting operation, to that at which the component 82 is to be mounted, it is not needed to further change the current angular position of the component 82. In this case, a negative judgment is made at Step S6, and the control goes to Step S8. On the other hand, if not, a positive judgment is made at Step S6, so that the control goes to Step S7 to change the angular position of the component 82 to that at which the component 82 is to be mounted.

In addition, in the case where an electronic component 82 is mounted, on the printed-wiring board 12, at the same angular position as that at which the component 82 is held by the suction nozzle 184, if the angular position of the component 82 is changed, during the coplanarity detecting operation, to an angular position different from that at which the component 82 is to be mounted, a positive judgment is made at Step S6, so that the control goes to Step S7 to change the angular position of the component 82 to that at which the component 82 is to be mounted. Step S7 is followed by Step S8.

At Step S8, the control device 300 operates the component camera 250 to take an image of the electronic component 82. More specifically described, a silhouette image of the component 82 projected in a light background formed by the light emitting plate 206 is first reflected by the reflecting surface 256 so as to travel in a horizontal direction, and then is reflected by the reflecting surface 258 so as to travel in an upward direction and be incident to the component camera 250. Thus, the silhouette image of the component 82 is taken by the camera 250.

Step S8 is followed by Step S9 to determine positional errors of the electronic component 82 held by the suction nozzle 184. More specifically described, the control device 300 processes image data representing the taken image, and compares the image data with reference or nominal image data representing a reference or nominal image having no positional errors. Thus, the control device 300 determines positional errors $\Delta X$, $\Delta Y$, and an angular-positional error $\Delta\theta$, of the component 82.

Concurrently with the above-described image-data processing operation, the control device 300 moves the component holding device 100 to a position right above a component-mounting place on the printed-wiring board 12. Then, the control goes to Step S10 to lower the suction nozzle 184 to mount the electronic component 82 at the component-mounting place on the component-mounting surface 28 of the board 12. In addition, the control device 300 resets flags F1, F2, F3 and thereby quits the routine of FIG. 11. During the movement of the component 82 toward the component-mounting place, respective distances of movement of the component holding device 100 in the X-axis and Y-axis directions are so changed as to correct the positional errors $\Delta X$, $\Delta Y$ of the component 82 and the positional errors $\Delta X'$, $\Delta Y'$ of the component-mounting place of the board 12, and additionally the component 82 is so rotated as to correct the angular-positional error $\Delta\theta$ thereof. Thus, the component 82 is mounted, on the board 12, at the correct component-mounting place and the correct angular position.

To mount the electronic component 82, the component holding device 100 is lowered by the Z-axis drive device 144, so that the suction nozzle 184 is lowered with the nozzle holder 186 and the leads 92 of the component 82 contact the printed-wiring board 12. Since the component 82 is judged as being acceptable based on the detected coplanarity of the leads 92, all the leads 92 are placed on the electric circuits on the board 12 such that the leads 92 substantially uniformly contact the circuits. Though the nozzle holder 186 is further moved downward by a small distance relative to the suction nozzle 184, this downward movement is allowed by compression of the spring 198. Thus, the biasing force of the spring 198 presses the component 82 against the board 12.

When the nozzle holder 186 is moved relative to the suction nozzle 184, the frame 212 attached to the upper end portion of the holder 186 is moved relative to the pipe 210 attached to the sleeve 190 of the suction nozzle 184, so that the dog 222 reflects the light emitted by the light emitter of the photoelectric switch 226 and accordingly the switch 226 generates, in place of the OFF signal, the ON signal. Thus, the control device 300 can recognize a commencement of the relative movement between the holder 186 and the nozzle 184.

A pressing load with which the electronic component 82 is pressed on the printed-wiring board 12 increases as the distance of relative movement between the suction nozzle 184 and the nozzle holder 186 increases. However, in the present embodiment, a predetermined pressing load is used commonly for all kinds of electronic components. To this end, the suction nozzle 184 and the nozzle holder 186 are moved relative to each other by a predetermined distance, that is, the spring 198 is compressed by a predetermined amount. After the commencement of the relative movement is detected, the Z-axis drive motor 164 is rotated by a predetermined angle or amount corresponding to the predetermined distance. The predetermined angle is detected by the encoder 170. Thus, the nozzle holder 186 is lowered by a distance corresponding to the predetermined pressing load, so that the component 82 is pressed with the predetermined load against the board 12. Subsequently, the nozzle 184 is communicated with the positive-pressure source, so that the nozzle 184 releases the component 82. Thus, the mount of the component 82 is finished. Then, the nozzle 184 is lifted up and moved to hold another electronic component 82.

On the other hand, if the coplanarity of the leads 92 of the electronic component 82 is judged as unacceptable, a negative judgment is made at Step S5, and the control goes to Step S11 to discard the unacceptable component 82. In the present embodiment, the suction nozzle 184 releases the unacceptable component 82 onto a discharging conveyor, not shown, provided on the machine base 10. The discharging conveyor is located at a predetermined discarding or discharging position within a range in which the component holding device 100 is allowed to move around, and the holding device 100 is moved to a position right above the discharging conveyor to place and release the component 82 onto the conveyor.

Though each electronic component 82 is accommodated in one component accommodating recess 80 of the component tray 76, the component 82 may be rotated so largely as to make it difficult to detect a coplanarity thereof. For example, in the case where the size of the recess 80 does not fit the size or kind of the component 82, that is, is too large, the component 82 may be rotated so largely in the recess 80. In this case, it is needed to carry out a preliminary inspection on an angular position of the component 82 after the component 82 is held by the suction nozzle 184 and before a coplanarity of the component 82 is detected.

Figure 13:
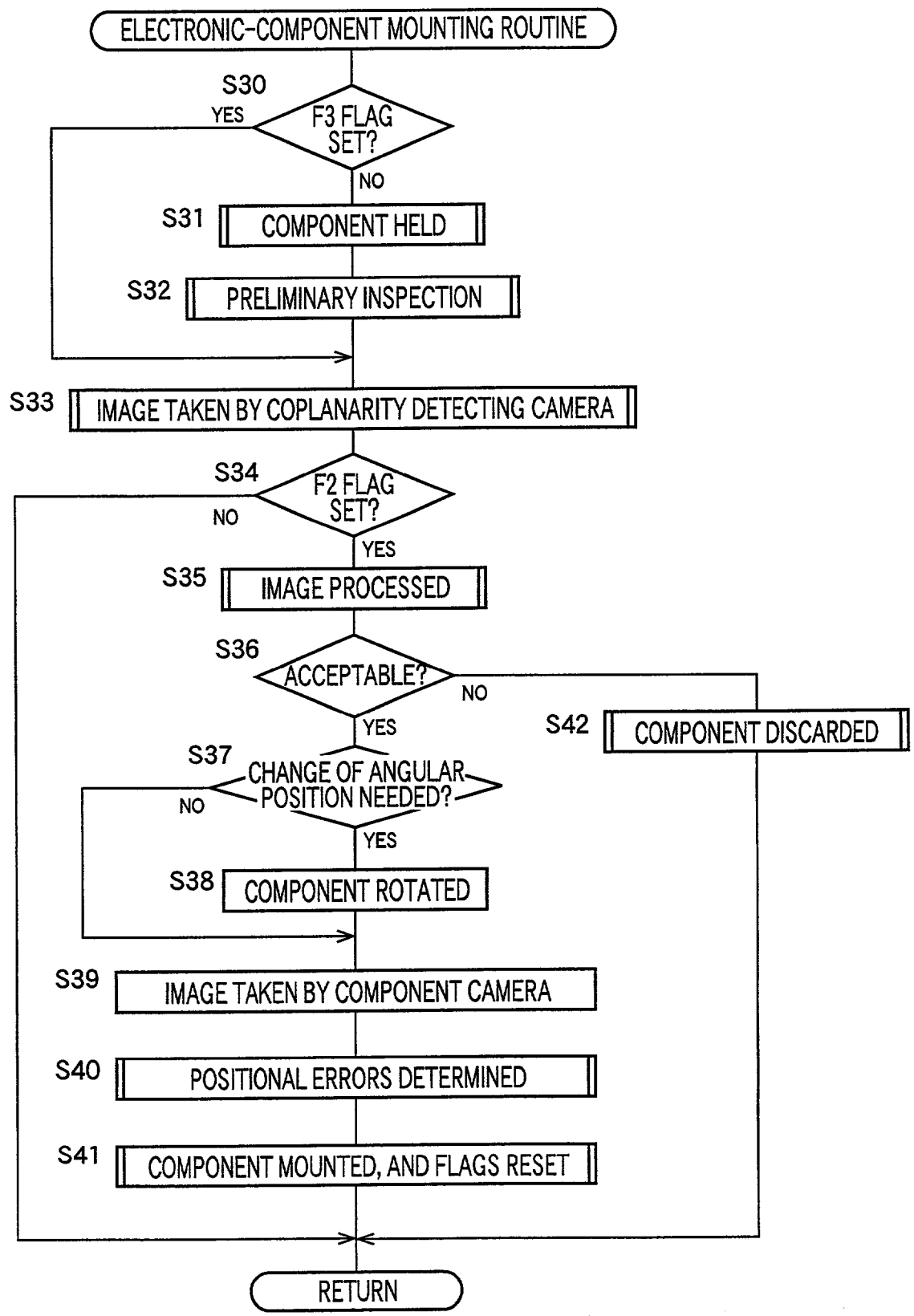
FIG. 13 is a flow chart representing another electronic-component mounting routine that may be stored in the RAM of the computer.

The control device 300 judges whether it is needed to carry out the above preliminary inspection, based on data representing the specific kind of the electronic component 82 to be mounted, and the specific kind of the component tray 76 accommodating the component 82. In the case where it is needed to carry out the preliminary inspection, the control device 300 performs an electronic-component mounting routine represented by the flow chart shown in FIG. 13. After the electronic component 82 is held by the suction nozzle 184 at Step S31, the control goes to Step S32 to carry out the preliminary inspection. More specifically described, after the component 82 is stopped at the position right above the reflecting mirror 252, the component camera 250 takes an image of the component 82 before the coplanarity detecting camera 270 takes an image of the same 82. Then, the control device 300 processes image data representing the image taken by the component camera 250, determines an angular-positional error of the component 82, and operates for rotating the component 82 to eliminate the error. Then, the control device 300 carries out Steps S33 and the following steps that are identical with Steps S2 and the following steps of FIG. 11.

The electronic components supplied from the feeder-type component-supply device 20 are mounted on the printed-wiring board 12 in the same manner as that in which the components 82 supplied from the tray-type component-supply device 22 are mounted on the board 12, except that a coplanarity of each component supplied from the first supply device 20 is not detected. More specifically described, the components supplied from the first supply device 20 are mounted on the board 12, according to an electronic-component mounting routine, not shown, that includes steps identical with Steps S0, S1, and S6 to S10 of FIG. 11.

As is apparent from the foregoing description of the illustrated embodiment, a portion of the control device 300 that carries out Steps S5 or S36 provides a judging portion which judges whether each electronic component 82 is acceptable. In addition, a portion of the control device 300 that carries out Step S4 or S35 provides a first image processing portion; a portion of the control device 300 that carries out Step S9 or S40 provides a second image processing portion; and the first and second image processing portions cooperate with each other to provide an image processing device. Moreover, a portion of the control device 300 that carries out Steps S2 or S33, and S6 to S8 or S37 to S39 provides an image-taking control portion; and a portion of the control device 300 that carries out Steps S11 or S42 provides a discarding control portion as a coplanarity-utilizing portion. In addition, a portion of the control device 300 that carries out Step S32 provides a preliminary-inspection control portion and an angular-error correcting portion.

In each of the illustrated embodiments, the predetermined pressing load is commonly used to press different kinds of electronic components against a printed-wiring board 12. However, it is possible to use different pressing loads for different kinds of electronic components, respectively. For example, different pressing loads may be used for different kinds of electronic components having different numbers of leads 92 or different rigidities. Alternatively, different pressing loads may be used for different kinds of electronic components having different lead coplanarities.

Next, there will be briefly explained the above-indicated last case, i.e., the case where different pressing loads are used for different kinds of electronic components having different lead coplanarities.

Even in the case where a lead coplanarity of an electronic component is not too low to be mounted on a printed-wiring board 12, if the component has one or more upwardly bent leads 92, it is preferred that an increased pressing load be used to cause the upwardly bent leads to contact the board, as compared with the case where an electronic component has no bent leads or has one or more downwardly bent leads only, so that the upwardly bent leads may surely contact an electric circuit provided on the board 12. To this end, if a detected lead coplanarity of the component indicates that the component is acceptable, a pressing load is determined based on an amount, and a direction, by and in, which one or more upwardly bent leads are deviated.

For an electronic component having one or more upwardly bent leads 92 but not having any downwardly bent leads 92, a greater pressing load is used than a pressing load used for an electronic component having no bent leads 92. The pressing load may be determined based on the greatest one of respective bending amounts of the upwardly bent leads (i.e., respective deviation amounts of the upwardly bent leads from a reference position), or an average of the respective bending amounts. The pressing load may be changed in proportion to the bending amount of lead 92, or alternatively may be changed stepwise. In the case where the component additionally has one or more downwardly bent leads 92, the increased pressing load may be too high to press the downwardly bent leads 92 against the board 12. In view of this, the amount of increasing of the pressing load may be modified. In the case where an electronic component has one or more downwardly bent leads only, the pressing load may be decreased, or may not be changed.

In the illustrated component mounting device 18, the pressing load may be changed by changing the distance of movement of the suction nozzle 184 relative to the nozzle holder 186 with the spring 198 being compressed after the leads 92 of the electronic component 82 contacts the printed-wiring board 12. In this case, after the pressing load is determined, the control device 300 calculates, as disclosed in the previously-mentioned Japanese patent document No. 4-372199, a distance of movement of the nozzle 184 relative to the holder 186, based on the thus determined pressing load, a set load, and a spring constant, of the spring 198, and a distance of movement of the nozzle 184 and the holder 186 till the commencement of the relative movement between the nozzle 184 and the holder 186, and calculates a rotation amount or angle of the Z-axis drive motor 164 that is needed to move the nozzle 184 relative to the holder 186 by the thus calculated distance. Those calculations are carried out after the coplanarity is detected and before the component 82 is mounted on the board 12. Thus, the component 82 is mounted on the board 12 while being pressed against the board 12 with the pressing load changed based on the bending of the leads 92. A portion of the computer or the control device 300 that determines the pressing load provides a pressing-load determining portion, which cooperates with a relative-movement-commencement detecting device that detects the commencement of relative movement between the nozzle 184 and the holder 186, and with a control portion of the computer or the control device 300 that controls the Z-axis drive motor 164 based on the detected commencement of the relative movement and the determined pressing load, to provide a pressing-load control device or a pressing-load changing device.

In each of the illustrated embodiments, the common reference value is used in judging whether each of the leads 92 of the electronic component 82 is upwardly bent, and in judging whether each of the leads 92 is downwardly bent. However, different reference values may be used for the two kinds of judgments. In the latter case, it is preferred that a reference value used to judge whether each lead 92 is upwardly bent be smaller than a reference value used to judge whether each lead 92 is downwardly bent. In the case where an electronic component has a downwardly bent lead, the pressing load with which the downwardly bent lead is pressed against a printed-wiring board 12 is greater than that with which a non-bent lead is pressed against the board 12. However, the downwardly bent lead can contact the board 12 and can be connected to an electric circuit provided on the board 12. On the other hand, in the case where an electronic component has an upwardly bent lead, if the bending amount of the lead is too great, the component may fail to contact a printed-wiring board 12 or be connected to an electric circuit on the board 12.

In each of the illustrated embodiments, the control device 300 judges whether each electronic component 82 is acceptable, by first comparing the deviation amount of each of the leads 92 extending from each of the sides of the component 82, with the reference value and, if the deviation amounts of all the leads of the each side are smaller than the reference value, then judging whether the coplanarity of each of the respective groups of leads 92 extending from the respective sides is acceptable. However, this judgment may be made all in one step. More specifically described, after an image of all the leads 92 of the component 82 is taken, the control device 300 may determine, based on the taken image, a virtual plane that is least deviated from all the leads, and judge whether a deviation amount of each of the leads from the virtual plane is smaller than a reference value.

It is possible to detect a coplanarity of the leads of each of the electronic components supplied from the feeder-type electronic-component supply device 20. In this case, a coplanarity detecting camera 270 is provided at a position corresponding to the ballscrew 104 that is provided, on the machine base 10, between the supply device 20 and the PWB conveyor 14, and a flat light emitter 280 is provided on the X-axis slide 106 such that the light emitter 280 faces the camera 270. Thus, a coplanarity of the leads of each electronic component supplied from the supply device 20 can be detected in a short time. For example, in the case where the supply device 20 supplies electronic components in the form of a carrier tape, such that the components are accommodated in respective accommodating recesses formed in the carrier tape and accordingly are substantially prevented from being moved out of position, each of the components is prevented from being largely rotated about its axis line, so that the component mounting device 18 can hold the substantially central portion of the each component with its correct angular position. Thus, a coplanarity of the component can be detected based on an image thereof taken without carrying out the previously-described preliminary inspection. However, the preliminary inspection may be carried out, as needed.

It is possible to use only a single combination of a coplanarity detecting camera and a background forming device to detect a coplanarity of leads of each of electronic components supplied from a plurality of electronic-component supplying devices. For example, the coplanarity detecting camera 270 and the flat light emitter 280 facing the camera 270, both provided between the tray-type electronic-component supply device 22 and the PWB conveyor 14, may be used commonly for the two supply devices 20, 22. After the component holding device 100 takes an electronic component from the feeder-type supply device 20, and before the holding device 100 mounts the component on the printed-wiring board 12, the holding device 100 is moved in the Y-axis direction to the position aligned with the coplanarity detecting camera 270, so that an image of the component held by the device 100 is taken by the camera 270 and a coplanarity of the component is detected. The commonly used coplanarity detecting camera and flat light emitter may be provided at a position equally distant from the two supply devices 20, 22.

In each of the illustrated embodiments, the electronic component 82 is stopped on the shortest way from the tray-type component-supply device 22 to the printed-wiring board 12, so that an image of the component 82 is taken by the coplanarity detecting device 270. Thus, respective images of different electronic components may be taken at different positions in the X-axis direction. However, an image of each of electronic components may be taken by the camera 270, at a predetermined image-taking position in the X-axis direction. For example, the image-taking position may be determined at a central position of a side of the tray-type supply device 22 that extends in the X-axis direction. In this case, the focal point of the camera 270 is fixed. Since the image-taking position is fixed, some electronic components 82 need to be moved to the image-taking position over respective increased distances. However, since the camera 270 is provided, as viewed in the Y-axis direction, on any path of movement of the component holding device 100 from the tray-type supply device 22 to the printed-wiring board 12, the increased amounts of the movement distances can be minimized.

In each of the illustrated embodiments, the coplanarity detecting camera 270 is provided on the machine base 10 such that the camera 270 is not movable relative to the base 10. However, the camera 270 may be provided on the X-axis slide 106 such that the camera 270 is not movable relative the slide 106.

Each of the first and second image taking devices is not limited to the surface-image taking device (i.e., the CCD camera 270, 250), but may be provided by a line-image taking device called "a line sensor". The line sensor has a number of image-taking elements arranged along a straight line and, while at least one of the line sensor and an object is moved relative to the other, the line sensor repetitively take respective line images of the object and thereby obtains a two-dimensional image of the object. In the case where the first image taking device is provided by the line sensor, the line sensor may be provided such that the image-taking elements thereof are arranged along a straight line intersecting a plane including an upper surface of an electronic component, and at least one of the line sensor and the component may be moved relative to the other in a direction parallel to the upper surface. Alternatively, the line sensor may be provided such that the image-taking elements thereof are arranged along a straight line parallel to the upper surface of the component, and at least one of the line sensor and the component may be moved relative to the other in a direction perpendicular to the plane including the upper surface. In either case, an optical axis of the line sensor is inclined by an appropriate angle relative to a plane including a bottom surface of a main body of the component, like the optical axis of the surface-image taking device.

In each of the illustrated embodiments, the image taking device 248 and the flat light emitter 280 are provided on the X-axis slide 106, so that an image of the electronic component 82 held by the component holding device 100 is taken on the shortest path of movement of the holding device 100 from the electronic-component supply device 22 to the printed-wiring board 12. However, this is not essentially needed. For example, the image taking device 248 and the flat light emitter 280 may be fixedly provided at any position within a range, on the machine base 10, in which the holding device 100 is allowed to move around.

In the case where an electronic component has a plurality of leads laterally extending from each of a plurality of sides thereof, respective numbers of leads extending from the different sides may differ from each other, or a length of the leads extending from one side may differ from that of the leads extending from another side. In addition, a main body or portion of an electronic component may have a rectangular shape different from a square shape.

While the preferred embodiments of the present invention have been described in detail, for illustrative purposes only, it is to be understood that the present invention may be embodied with various changes and improvements, such as those described in SUMMARY OF THE INVENTION, that may occur to a person skilled in the art.

What is claimed is:

1. An apparatus for detecting a coplanarity of a plurality of leads of an electronic component that laterally extend from a main body thereof, the main body having, in a plan view thereof, a shape including a plurality of straight side portions from each of which the leads laterally extend, the apparatus comprising:
   a holding device which holds the main body of the electronic component at an upper surface of the main body, wherein the holding device includes a rotating device which rotates the electronic component about an axis line thereof that perpendicularly passes through the upper surface of the main body;
   an image taking device which faces the electronic component held by the holding device and has an optical axis that is inclined by a predetermined angle relative to a plane containing a bottom surface of the main body such that in a direction from the image taking device toward the electronic component, the optical axis goes down in a direction from the upper surface to the bottom surface, wherein the rotating device rotates the electronic component, about the axis line thereof, to each of a plurality of angular positions at which a corresponding one of the plurality of side portions of the main body extends in a direction substantially perpendicular to the optical axis of the image taking device, at a position between the axis line of the electronic component and the image taking device, so that the image taking device takes an image of respective end portions of the leads extending from said one side portion of the main body;
   a background forming device which is provided on one of opposite sides of the electronic component that is opposite to the other side thereof on which the image taking device is provided, and which forms a background having an optical characteristic different from an optical characteristic of the leads; and
   an image processing device which processes the image of the respective end portions of the leads taken by the image taking device and thereby determines, as a first coplanarity, the coplanarity of the leads extending from said one side portion of the main body.

2. The apparatus according to claim 1, wherein the background forming device comprises a light emitter which emits a light toward the electronic component and the image taking device.

3. The apparatus according to claim 1, further comprising a judging device which judges, based on at least one of the first coplanarities determined by the image processing device with respect to the respective side portions of the main body of the electronic component, whether the electronic component is acceptable.

4. The apparatus according to claim 1, wherein the image processing device determines, based on the respective first coplanarities determined thereby with respect to the respective side portions of the main body of the electronic component, a second coplanarity of the leads extending from all the side portions of the main body.

5. The apparatus according to claim 4, further comprising a judging device which judges, based on the second coplanarity determined by the image processing device, whether the electronic component is acceptable.

6. An apparatus for detecting a condition of an electronic component including a main body and a plurality of leads laterally extending from the main body, the apparatus comprising:
   a holding device which holds the main body of the electronic component at an upper surface of the main body;
   a first image taking device which faces the electronic component held by the holding device and has an optical axis that is inclined by a predetermined angle relative to a plane containing a bottom surface of the main body such that in a direction from the image taking device toward the electronic component, the optical axis goes down in a direction from the upper surface to the bottom surface, and which takes an image of respective end portions of the leads;
   a background forming device which is provided on one of opposite sides of the electronic component that is opposite to the other side thereof on which the image taking device is provided, and which forms a background having an optical characteristic different from an optical characteristic of the leads;
   a second image taking device which is different from the first image taking device and which takes an image of the bottom surface of the electronic component as viewed in a direction perpendicular to the bottom surface of the electronic component;
   an image-taking-device control portion which controls the first and second image taking devices to take the image of the respective end portions of the leads and the image of the bottom surface of the electronic component, respectively, at respective different timings; and
   an image processing device which comprises a first image processing portion which processes the image of the respective end portions of the leads taken by the first image taking device and thereby determines a coplanarity of the leads, and a second image processing portion which processes the image of the bottom surface of the electronic component taken by the second image taking device and thereby determines at least one positional error of the electronic component relative to the holding device in at least one direction parallel to the upper surface of the main body.

7. The apparatus according to claim 6, wherein the first and second image taking devices are provided at respective different positions at which the first and second image taking devices can take the image of the leads of the electronic component and the image of the bottom surface of the electronic component, respectively, in a state in which the electronic component is positioned at a same position.

8. The apparatus according to claim 6, wherein the image-taking-device control portion first controls the first image taking device to take the image of the leads of the electronic component and then controls the second image taking device to take the image of the bottom surface of the electronic component.

9. The apparatus according to claim 8, wherein the holding device comprises a rotating device which rotates the electronic component about an axis line thereof that perpendicularly passes through the upper surface of the main body, and wherein the image-taking-device control portion controls the rotating device to rotate the electronic component to an angular position at which the electronic component is to be mounted on a circuit substrate, and subsequently controls the second image taking device to take the image of the bottom surface of the electronic component.

10. The apparatus according to claim 6, wherein the image-taking-device control portion first controls the second image taking device to take the image of the bottom surface of the electronic component and then controls the first image taking device to take the image of the leads of the electronic component.

11. The apparatus according to claim 10, wherein the second image processing portion processes the image of the bottom surface of the electronic component taken by the second image taking device and thereby determines an angular-positional error of the electronic component about an axis line thereof that perpendicularly passes through the upper surface of the main body.

12. The apparatus according to claim 11, wherein the holding device comprises a rotating device which rotates the electronic component about the axis line thereof, and wherein the image-taking-device control portion controls the rotating device to rotate the electronic component to eliminate the angular-positional error determined by the second image processing portion, and subsequently controls the first image taking device to take the image of the leads of the electronic component.

13. A system for mounting at least one electronic component on a circuit substrate, the electronic component including a main body and a plurality of leads laterally extending from the main body, the system comprising:

a holding device which holds the main body of the electronic component at an upper surface of the main body;

a first image taking device which faces the electronic component held by the holding device and has an optical axis that is inclined by a predetermined angle relative to a plane containing a bottom surface of the main body such that in a direction from the image taking device toward the electronic component, the optical axis goes down in a direction from the upper surface to the bottom surface, and which takes an image of respective end portions of the leads;

a background forming device which is provided on one of opposite sides of the electronic component that is opposite to the other side thereof on which the image taking device is provided, and which forms a background having an optical characteristic different from an optical characteristic of the leads;

a second image taking device which is different from the first image taking device and which takes an image of the bottom surface of the electronic component as viewed in a direction perpendicular to the bottom surface of the electronic component;

an image-taking-device control portion which controls the first and second image taking devices to take the image of the respective end portions of the leads and the image of the bottom surface of the electronic component, respectively, at respective different timings;

an image processing device including a first image processing portion which processes the image of the respective end portions of the leads taken by the first image taking device and thereby determines a coplanarity of the leads, and a second image processing portion which processes the image of the bottom surface of the electronic component taken by the second image taking device and thereby determines at least one positional error of the electronic component relative to the holding device in at least one direction parallel to the upper surface of the main body;

a supplying device which supplies the electronic component to the holding device;

a supporting device which supports the circuit substrate;

a moving device which moves, while correcting the positional error of the electronic component detected by the image processing device, the holding device holding the electronic component, from the supplying device to the supporting device via the first and second image taking devices, and allows the holding device to mount the electronic component on the circuit substrate supported by the supporting device; and a coplanarity-utilizing control portion which controls the moving device while utilizing the coplanarity detected by the image processing device.

14. The system according to claim 13, wherein the coplanarity-utilizing control portion comprises a judging device which judges, based on the coplanarity detected by the image processing device, whether the electronic component is acceptable, and a discarding control portion which controls, when the judging device judges that the electronic component is not acceptable, the moving device to discard the electronic component at a predetermined discarding position.

15. The system according to claim 13, wherein the moving device comprises:

an X-axis slide which is movable in an X-axis direction parallel to an X axis of an X-Y coordinate plane parallel to a surface of the circuit substrate;

an X-axis-slide moving device which moves the X-axis slide to an arbitrary position in the X-axis direction;

a Y-axis slide which is supported by the X-axis slide such that the Y-axis slide is movable relative to the X-axis slide in a Y-axis direction parallel to a Y axis of the X-Y coordinate plane that is perpendicular to the X axis; and a Y-axis-slide moving device which moves the Y-axis slide to an arbitrary position in the Y-axis direction; and wherein the holding device is supported by the Y-axis slide.

16. The system according to claim 15, wherein the first and second image taking devices are provided at respective different positions at which the first and second image taking devices can take the image of the leads of the electronic component and the image of the bottom surface of the electronic component, respectively, in a state in which the electronic component is on a path of movement thereof caused by a movement of the Y-axis slide relative to the X-axis slide.

17. The system according to claim 16, wherein the background forming device is provided on the X-axis slide.

18. The system according to claim 17, wherein the first image taking device comprises a camera which is provided at a position where the camera faces the background forming device through the electronic component held by the holding device.

19. The system according to claim 13, wherein the second image taking device comprises a direction changing device which is provided on the X-axis slide such that a first portion of the direction changing device faces the electronic component held by the holding device, and a camera which is also provided on the X-axis slide such that the camera faces a second portion of the direction changing device.

* * * * *